United States Patent
Kunitake et al.

(10) Patent No.: US 11,430,791 B2
(45) Date of Patent: Aug. 30, 2022

(54) SEMICONDUCTOR DEVICE AND OPERATION METHOD THEREOF

(71) Applicant: SEMICONDUCTOR ENERGY LABORATORY CO., LTD., Atsugi (JP)

(72) Inventors: Hitoshi Kunitake, Kanagawa (JP); Ryunosuke Honda, Kanagawa (JP); Tomoaki Atsumi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 215 days.

(21) Appl. No.: 16/959,771

(22) PCT Filed: Jan. 11, 2019

(86) PCT No.: PCT/IB2019/050207
§ 371 (c)(1),
(2) Date: Jul. 2, 2020

(87) PCT Pub. No.: WO2019/142081
PCT Pub. Date: Jul. 25, 2019

(65) Prior Publication Data
US 2020/0365591 A1    Nov. 19, 2020

(30) Foreign Application Priority Data

Jan. 19, 2018 (JP) .............................. JP2018-007209

(51) Int. Cl.
*H01L 27/108* (2006.01)
*G11C 11/405* (2006.01)
(Continued)

(52) U.S. Cl.
CPC .......... *H01L 27/108* (2013.01); *G11C 11/405* (2013.01); *G11C 11/4074* (2013.01); *H01L 29/66083* (2013.01)

(58) Field of Classification Search
CPC ............. H01L 27/108; H01L 29/66083; H01L 29/7869; G11C 11/405; G11C 11/4074; G11C 11/4023
See application file for complete search history.

(56) References Cited

U.S. PATENT DOCUMENTS 5,247,208 A    9/1993   Nakayama
5,397,934 A    3/1995   Merrill et al.
(Continued)

FOREIGN PATENT DOCUMENTS

EP    0704072 A     4/1996
JP    08-508600     9/1996
(Continued)

OTHER PUBLICATIONS

International Search Report (Application No. PCT/IB2019/050207) dated Mar. 26, 2019.
(Continued)

*Primary Examiner* — Tri M Hoang
(74) *Attorney, Agent, or Firm* — Fish & Richardson P.C.

(57) ABSTRACT

A semiconductor device capable of obtaining the threshold voltage of a transistor is provided. The semiconductor device includes a first transistor, a first capacitor, a first output terminal, a first switch, and a second switch. A gate and a source of the first transistor are electrically connected to each other. A first terminal of the first capacitor is electrically connected to the source. A second terminal and the first output terminal of the first capacitor are electrically connected to a back gate of the first transistor. The first switch controls input of a first voltage to the back gate. A second voltage is input to a drain of the first transistor. The second switch controls input of a third voltage to the source.

17 Claims, 21 Drawing Sheets

(51) Int. Cl.
*G11C 11/4074* (2006.01)
*H01L 29/66* (2006.01)

(56) References Cited

U.S. PATENT DOCUMENTS

| | | | |
|---|---|---|---|
| 8,737,109 B2 | 5/2014 | Yamazaki et al. | |
| 8,957,889 B2* | 2/2015 | Miyake | G09G 3/32 345/212 |
| 9,378,777 B2 | 6/2016 | Koyama | |
| 9,385,592 B2* | 7/2016 | Watanabe | H02M 3/073 |
| 9,472,559 B2 | 10/2016 | Shionoiri et al. | |
| 10,998,447 B2 | 5/2021 | Onuki et al. | |
| 2015/0263175 A1 | 9/2015 | Koyama | |
| 2016/0307607 A1 | 10/2016 | Koyama | |
| 2017/0271516 A1* | 9/2017 | Onuki | H01L 27/11563 |
| 2017/0302271 A1* | 10/2017 | Kato | G11C 11/4091 |
| 2019/0251921 A1* | 8/2019 | Ono | G09G 3/20 |

FOREIGN PATENT DOCUMENTS

| | | |
|---|---|---|
| JP | 2012-069932 A | 4/2012 |
| JP | 2015-188214 A | 10/2015 |
| KR | 2016-0132405 A | 11/2016 |
| TW | 201539978 | 10/2015 |
| TW | 201803131 | 1/2018 |
| WO | WO-1994/023353 | 10/1994 |
| WO | WO-2015/136413 | 9/2015 |

OTHER PUBLICATIONS

Written Opinion (Application No. PCT/IB2019/050207) dated Mar. 26, 2019.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Ishizu.T et al., "Embedded Oxide Semiconductor Memories: A Key Enabler for Low-Power ULSI", ECS Transactions, May 21, 2017, vol. 79, No. 1, pp. 149-156, The Electrochemical Society.

Taiwanese Office Action (Application No. 108100465) dated Jun. 24, 2022.

\* cited by examiner

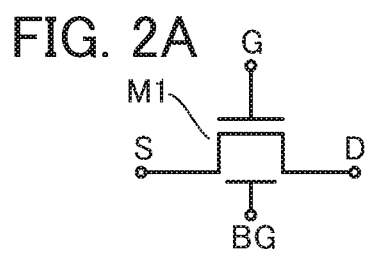
FIG. 2A
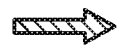
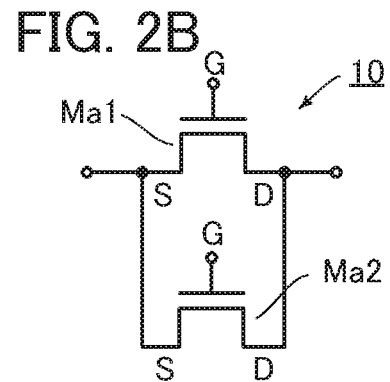
FIG. 2B

SEMICONDUCTOR DEVICE AND OPERATION METHOD THEREOF

CROSS REFERENCE TO RELATED APPLICATIONS

This application is a U.S. National Phase Application under 35 U.S.C. § 371 of International Application PCT/IB2019/050207, filed on Jan. 11, 2019, which is incorporated by reference and claims the benefit of a foreign priority application filed in Japan on Jan. 19, 2018, as Application No. 2018-007209.

TECHNICAL FIELD

In this specification, a semiconductor device, an operation method thereof, a manufacturing method thereof, and the like are described.

In this specification, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

BACKGROUND ART

As a semiconductor that can be used in a transistor, a metal oxide has been attracting attention. An In—Ga—Zn oxide called "IGZO" and the like is a typical multi-component metal oxide. From the researches on IGZO, a CAAC (c-axis aligned crystalline) structure and an nc (nanocrystalline) structure, which are not single crystal nor amorphous, have been found (e.g., Non-Patent Document 1).

It has been reported that a transistor including a metal oxide semiconductor in a channel formation region (hereinafter, such a transistor may be referred to as an "oxide semiconductor transistor" or an "OS transistor") has an extremely low off-state current (e.g., Non-Patent Documents 1 and 2). A variety of semiconductor devices using OS transistors have been manufactured (e.g., Non-Patent Documents 3 and 4). The manufacturing process of an OS transistor can be incorporated in a CMOS process with a conventional Si transistor, and an OS transistor can be stacked over a Si transistor (e.g., Non-Patent Document 4).

The threshold voltage of a Si transistor can be easily controlled by impurity introduction. In contrast, highly reliable technology for controlling the threshold voltage of an OS transistor has not yet been established. In view of this, the threshold voltage of an OS transistor is controlled by providing a first gate electrode (also referred to as a gate or a front gate) and a second gate electrode (also referred to as a back gate) for the OS transistor and controlling the voltage of the second gate electrode (e.g., Patent Document 1).

REFERENCE

Patent Document

[Patent Document 1] Japanese Published Patent Application No. 2012-069932

Non-Patent Document

[Non-Patent Document 1] S. Yamazaki et al., "Properties of crystalline In—Ga—Zn-oxide semiconductor and its transistor characteristics", Jpn. J. Appl. Phys., vol. 53, 04ED18 (2014).

[Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51, 021201 (2012).

[Non-Patent Document 3] S. Amano et al., "Low Power LC Display Using In—Ga—Zn-Oxide TFTs Based on Variable Frame Frequency", SID Symp. Dig. Papers, vol. 41, pp. 626-629 (2010).

[Non-Patent Document 4] T. Ishizu et al., "Embedded Oxide Semiconductor Memories: A Key Enabler for Low-Power ULSI", ECS Tran., vol. 79, pp. 149-156 (2017).

SUMMARY OF THE INVENTION

Problems to be Solved by the Invention

An object of one embodiment of the present invention is to provide a semiconductor device capable of obtaining the threshold voltage of a transistor, to provide a semiconductor device in which a change in performance due to temperature is inhibited, to provide a semiconductor device with high reliability, or to provide a semiconductor device with low power consumption, for example.

The description of a plurality of objects does not disturb the existence of each object. One embodiment of the present invention does not necessarily achieve all the objects described as examples. Furthermore, objects other than those listed are apparent from description of this specification, and such objects can be objects of one embodiment of the present invention.

Means for Solving the Problems (1) One embodiment of the present invention is a semiconductor device including a first transistor, a first capacitor, a first output terminal, a first switch, and a second switch; a gate and a source of the first transistor are electrically connected to each other; a first terminal of the first capacitor and the first output terminal are electrically connected to a back gate of the first transistor; a second terminal of the first capacitor is electrically connected to the source; the first switch controls input of a first voltage to the back gate; a second voltage is input to a drain of the first transistor; and the second switch controls input of a third voltage to the source.

(2) One embodiment of the present invention is a method for operating the semiconductor device of the above-described embodiment (1), including turning on the first switch and the second switch, turning on the first switch and turning off the second switch, turning off the first switch and turning off the second switch, and turning off the first switch and turning on the second switch.

In this specification, ordinal numbers such as "first", "second", and "third" may be used to show the order. Alternatively, ordinal numbers may be used to avoid confusion among components. In these cases, the ordinal numbers do not limit the number of the components of one embodiment of the invention. For example, it is possible to replace the term "first" with the term "second" or "third" in describing one embodiment of the present invention.

The positional relation between components of one embodiment of the invention is relative. Therefore, when the components are described with reference to drawings, terms for describing the positional relation, such as "over" and "under", may be used for convenience. The positional relation of the components is not limited to that described in this specification and can be explained with other terms as appropriate depending on the situation.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than a connection relation shown in drawings or text is regarded as being disclosed in the drawings or the text. Each of X and Y denotes an object (e.g., a device, an element, a circuit, a wiring, an electrode, a terminal, a conductive film, or a layer).

A voltage refers to a potential difference between a given potential and a reference potential (e.g., a ground potential (GND) or a source potential) in many cases. Thus, a voltage can be replaced with a potential. Note that a potential is relative. Thus, the expression "GND" does not necessarily mean 0 V.

A node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification, the terms "film" and "layer" can be interchanged with each other depending on the case or circumstances. For example, the term "conductive layer" can be changed to the term "conductive film" in some cases. For example, the term "insulating film" can be changed to the term "insulating layer" in some cases.

In the drawings, the size, the layer thickness, or the region is exaggerated for clarity in some cases. Therefore, they are not limited to the illustrated scale. The drawings are schematic views showing ideal examples, and shapes or values are not limited to those shown in the drawings. For example, variation in signal, voltage, or current due to noise or variation in signal, voltage, or current due to difference in timing can be included.

Effect of the Invention

According to one embodiment of the present invention, a semiconductor device capable of obtaining the threshold voltage of a transistor can be provided, a semiconductor device in which a change in performance due to temperature is reduced can be provided, a semiconductor device with high reliability can be provided, or a semiconductor device with low power consumption can be provided.

The description of a plurality of effects does not disturb the existence of other effects. One embodiment of the present invention does not necessarily achieve all the effects described as examples. Furthermore, objects, effects, and novel features other than those described above are apparent from description and drawings of this specification.

BRIEF DESCRIPTION OF THE DRAWINGS

FIG. 2 A: A diagram illustrating a transistor having a back gate. B: An equivalent circuit diagram of the transistor having a back gate.

MODE FOR CARRYING OUT THE INVENTION

Figure 1:
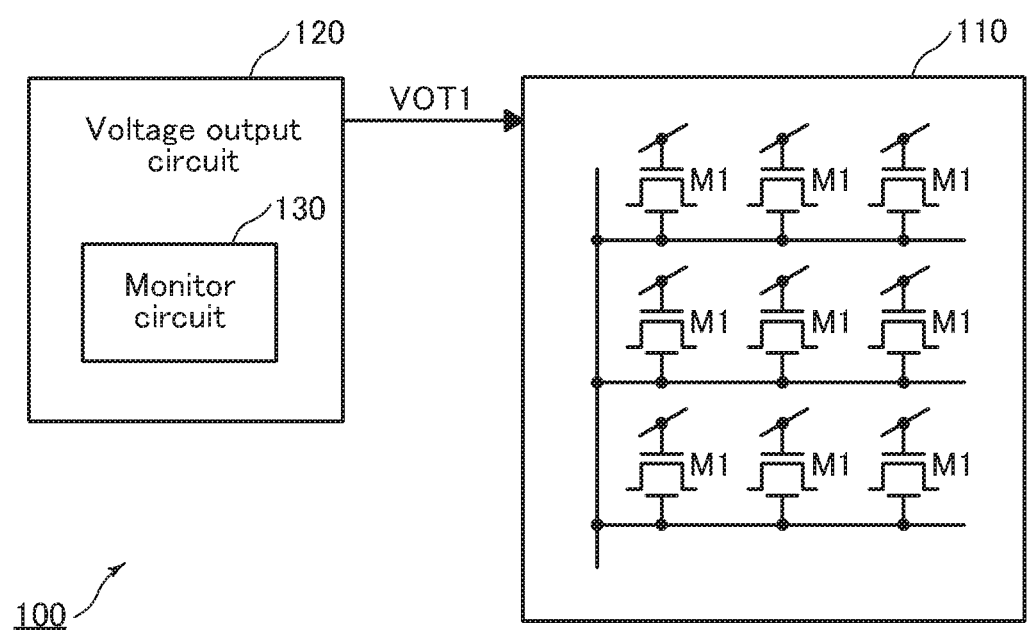
FIG. 1 A functional block diagram illustrating a structure example of a semiconductor device.

Embodiments of the present invention will be described below. Note that one embodiment of the present invention is not limited to the following description, and it will be readily appreciated by those skilled in the art that modes and details of the present invention can be modified in various ways without departing from the spirit and scope of the present invention. One embodiment of the present invention therefore should not be construed as being limited to the following description of the embodiments.

A plurality of embodiments described below can be combined as appropriate. In addition, in the case where a plurality of structure examples (including a manufacturing method example, an operation method example, a usage example, and the like) are given in one embodiment, the structure examples can also be combined as appropriate, and any of the structure examples can also be combined with one or more structure examples described in the other embodiments.

The same components, components having similar functions, components made of the same material, components formed at the same time, and the like in the drawings are denoted by the same reference numerals, and repetitive description thereof is skipped in some cases.

In this specification, a power supply potential VDD may be abbreviated to a potential VDD, VDD, or the like, for example. The same applies to other components (e.g., a signal, a voltage, a circuit, an element, an electrode, a wiring, and the like).

Moreover, when a plurality of components are denoted by the same reference numerals, and, in particular, need to be distinguished from each other, an identification sign such as "_1", "_2", "[n]", or "[m,n]" is sometimes added to the reference numerals. For example, the second wiring GL is referred to as a wiring GL[2].

Embodiment 1

In this embodiment, a semiconductor device or the like including a transistor having a back gate will be described.

<<Semiconductor Device 100>>

FIG. 1 is a functional block diagram of a semiconductor device 100. The semiconductor device 100 includes a semiconductor device 110 and a voltage output circuit 120. The semiconductor device 110 includes a transistor M1. The voltage output circuit 120 includes a monitor circuit 130. The monitor circuit 130 has a function of monitoring a change in the electrical characteristics of the transistor M1. The voltage output circuit 120 adjusts a voltage VOT1 on the basis of information obtained by the monitor circuit 130. The semiconductor device 110 is supplied with the voltage VOT1 from the voltage output circuit 120.

The threshold voltage of the transistor M1 is described with reference to FIG. 2A and FIG. 2B. The transistor M1 has a source (S), a drain (D), a gate (G), a back gate (BG), and a semiconductor layer. The gate and the back gate that sandwich the semiconductor layer are provided at the top and the bottom, and a channel formation region is provided in the semiconductor layer.

The transistor M1 is turned on or off in accordance with a voltage difference between the source and the drain (hereinafter, referred to as a voltage Vgs) or a voltage difference between the back gate and the source (hereinafter, referred to as a voltage Vbgs). When the voltage Vgs becomes higher than VTg, a channel may be formed (or a carrier may be induced) in a region on the gate side of the semiconductor layer. When the voltage Vbgs becomes higher than VTbg, a channel may be formed (or a carrier may be induced) in a region on the back gate side of the semiconductor layer. In other words, the transistor M1 has two threshold voltages, VTg and VTbg. VTg is a threshold voltage with respect to the voltage Vgs, and VTbg is a threshold voltage with respect to the voltage Vbgs.

In the case of Vgs>VTg or Vbgs>VTbg, the transistor M1 is turned on. Accordingly, it can be said that the transistor M1 has a function equivalent to that of a circuit 10 (see FIG. 2B) in which a transistor Ma1 having a threshold voltage of VTg and a transistor Ma2 having a threshold voltage of VTbg are electrically connected to each other in parallel.

Formation of a channel of the transistor M1 is controlled by the gate voltage Vg and the back gate voltage Vbg; thus, VTg depends on Vbgs and VTbg depends on Vgs. Conditions where the transistor M1 is turned on are represented by the following formula (1.1) in some cases, for example. In Formula (1.1), $VT_0$ represents a constant voltage, Cg represents gate capacitance per unit area between the gate and the semiconductor layer, and Cbg represents back gate capacitance per unit area between the back gate and the semiconductor layer.

$$(Cg \times Vgs + Cbg \times Vbgs)/(Cg + Cbg) > VT_0 \qquad (1.1)$$

In the above case, VTg can be represented by a linear function of Vbgs shown in Formula (1.2).

$$VTg = (1 + Cbg/Cg) \times VT_0 - Cbg/Cg \times Vbgs \qquad (1.2)$$

Electric field strength between the gate and the semiconductor layer depends on the gate capacitance between the gate and the semiconductor layer, and electric field strength between the back gate and the semiconductor layer depends on the gate capacitance between the back gate and the semiconductor layer. Therefore, as shown in Formula (1.3), VTbg is represented by a linear function using VTg as a variable in some cases. β represents a coefficient and $V_\beta$ represents a constant voltage.

$$VTbg = \beta \times VTg + V_\beta \qquad (1.3)$$

In this specification, in a Vgs–$Id^{1/2}$ characteristic curve in which the horizontal axis represents the voltage Vgs and the vertical axis represents the square root of a drain current Id, the threshold voltage VTg refers to the voltage Vgs at the intersection of an extrapolated straight line that is tangent to the highest inclination and $Id^{1/2}=0$ A. Similarly, in a Vbgs–$Id^{1/2}$ characteristic curve in which Vgs is 0 V, the threshold voltage VTbg refers to the voltage Vbgs at the intersection of an extrapolated straight line that is tangent to the highest inclination and $Id^{1/2}=0$ A.

When the channel length/channel width of a transistor is L/W, the threshold voltage VTg may refer to the voltage Vgs when Id×L/W is $1 \times 10^{-12}$ [A]. In addition, the threshold voltage VTbg may refer to the voltage Vbgs when Vgs is 0 V and Id×L/W is $1 \times 10^{-12}$ [A].

Note that in this specification, the threshold voltage VTg of a transistor having a back gate is calculated from Vgs–$Id^{1/2}$ characteristics in the case of Vbgs of 0 V.

Electrical characteristics of a transistor depend on temperature. It is confirmed that the relation between VTg(T) and Vbg(T) at temperature T is represented by Formula (1.4). Tref represents reference temperature and α represents a coefficient.

$$Vbg(T) - Vbg(Tref) = \alpha(VTg(T) - VTg(Tref)) \qquad (1.4)$$

<<Monitor Circuit 130>>

Figure 3A:
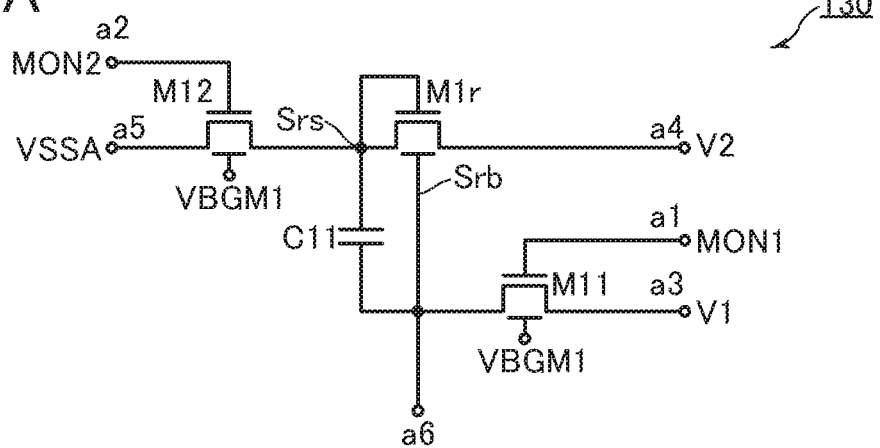
FIG. 3 A: A circuit diagram illustrating a configuration example of a monitor circuit. B: A timing chart showing an operation example of the monitor circuit.

FIG. 3A illustrates a circuit configuration example of the monitor circuit 130. The monitor circuit 130 includes transistors M1r, M11, and M12, a capacitor C11, nodes Srb and Srs, and terminals a1 to a6.

Here, the transistors M1r, M11, and M12 are OS transistors having back gates. The nodes Srb and Srs correspond to the back gate and a source of the transistor M1r, respectively. A voltage VBGM1 is input to the back gate of each of the transistors M11 and M12. A voltage different from the voltage VBGM1 may be input to the back gate of the transistor M12.

A gate and a drain of the transistor M1r are electrically connected to the node Srs and the terminal a4, respectively. A gate, a source, and a drain of the transistor M11 are electrically connected to the terminal a1, the node Srb, and the terminal a3, respectively. A gate, a source, and a drain of the transistor M12 are electrically connected to the terminal a2, the terminal a5, and the node Srs, respectively. A first terminal and a second terminal of the capacitor C11 are electrically connected to the nodes Srb and Srs, respectively.

Signals MON1 and MON2 are input to the terminals a1 and a2, respectively. The low level ("L") and the high level ("H") of the signals MON1 and MON2 are VSSA and VDDA, respectively. The voltage VSSA is, for example, 0 V or GND. Voltages V1, V2, and VSSA are input to the terminals a3, a4, and a5, respectively. The terminal a6 is an output terminal of the monitor circuit 130 and is electrically connected to the node Srb.

The monitor circuit 130 has a function of monitoring the threshold voltage VTbg of the transistor M1r. The transistor M1r is typically a replica transistor of the transistor M1 and has the same specifications as the transistor M1. By changing the back gate voltage Vbg and/or the gate voltage Vg of the transistor M1 on the basis of information on the threshold voltage VTbg of the transistor M1r that is obtained by the monitor circuit 130, a change in the threshold voltage VTg and/or VTbg of the transistor M1 can be corrected, for example.

An operation example of the monitor circuit 130 is described with reference to FIG. 3A, FIG. 3B, and FIG. 4A to FIG. 4D. In the following description, the threshold voltages VTg(T) and VTbg(T) and the voltages Vgs, Vbgs, and Vds of the transistor M1r are denoted by VTg(T)_r, VTbg(T)_r, Vgs_r, Vbgs_r, and Vds_r, respectively. In this specification, the absolute values of the threshold voltage of a transistor in the best case and the worst case of PVT (process, voltage, and temperature) are maximum and minimum, respectively. The operating temperature range of the semiconductor device 100 is from Tmin to Tmax, and the temperatures in the best case and the worst case are Tmin and Tmax, respectively.

Figure 3B:
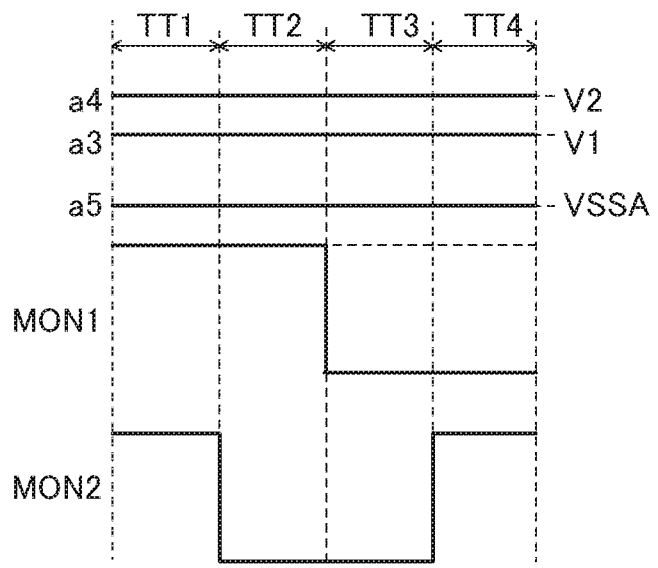
Figure 4A:
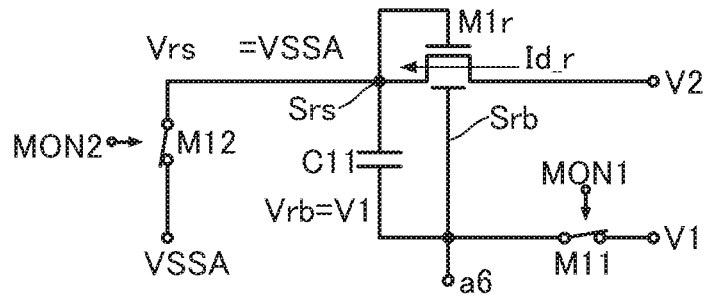
FIG. 4 A to D: Circuit diagrams illustrating an operation example of a monitor circuit.
Figure 4B:
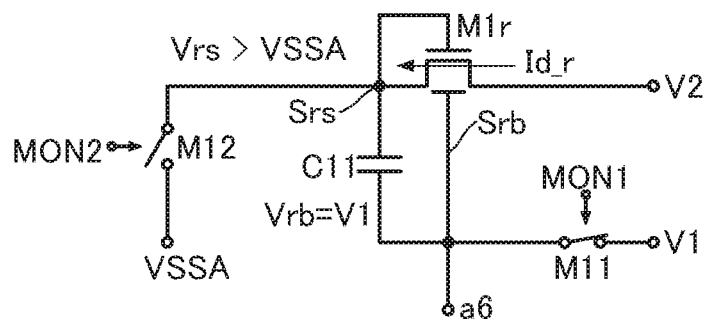
Figure 4C:
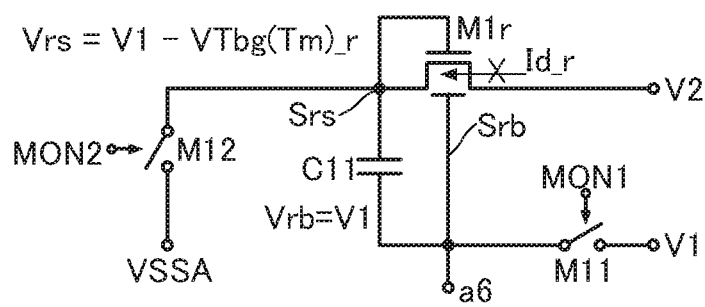
Figure 4D:
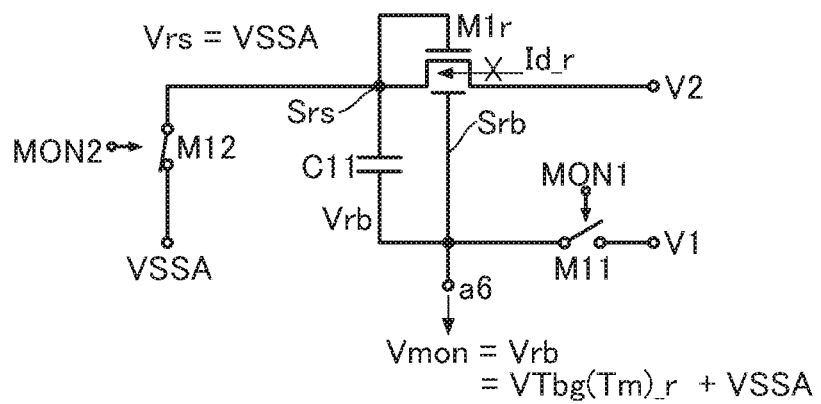

FIG. 3B is a timing chart of the monitor circuit 130 in Periods TT1 to TT4. FIG. 4A to FIG. 4D are simple circuit diagrams illustrating an operation of the monitor circuit 130 in Periods TT1 to TT4, respectively, and the transistors M11 and M12 are illustrated as switches. Vrs and Vrb represent the voltages of the nodes Srs and Srb, respectively, and Id_r represents a drain current of the transistor M1r. Temperature is represented by Tm.

(Period TT1: Initializing Operation)

In Period TT1, the nodes Srs and Srb are initialized. The signals MON1 and MON2 at "H" are input to the monitor circuit 130 to turn on the transistors M11 and M12. To the nodes Srs and Srb, VSSA and V1 are input, respectively.

Since the transistor M1r is an n-channel transistor, voltages V1, V2, and Va are set to satisfy Formulae (2.1) to (2.3). Va represents a constant voltage.

$$V1 > VTbg(Tmin)\_r \quad (2.1)$$

$$V2 = V1 - VTbg(Tmax)\_r + Va > VSSA \quad (2.2)$$

$$VTbg(Tmin)\_r - VTbg(Tmax)\_r + Va > 0 \quad (2.3)$$

Since Formula (2.1) is satisfied, the transistor M1r shows normally-on characteristics in the operating temperature range. Since Formulae (2.1) to (2.3) are satisfied, the voltage Vds_r=V2−VSSA is higher than 0 V. Thus, the drain current Id_r flows.

(Period TT2)

The signal MON2 at "L" is input to the monitor circuit 130 to turn off the transistor M12. The node Srs is brought into an electrically floating state.

By the drain current Id_r, the capacitor C11 is charged and the voltage Vrs increases. Thus, the voltage Vbgs_r decreases and the transistor M1r operates in a subthreshold region. When the voltage Vbgs_r reaches a threshold voltage VTbg(Tm)_r, the transistor M1r is turned off; thus, the voltage Vrs converges to V1−VTbg(Tm)_r. Note that for easy understanding of the operation of the monitor circuit 130, the leakage currents of the transistors M1r, M11, and M12 are ignored.

Since Formulae (2.1) to (2.3) are satisfied, even in the state where the voltage Vrs converges to V1−VTbg(Tm)_r, the voltage Vds_r of the transistor M1r is higher than 0 V in the operating temperature range.

(Period TT3)

The signal MON1 at "L" is input to the monitor circuit 130 to turn off the transistor M11. In Period TT3, the nodes Srs and Srb are brought into an electrically floating state. A voltage difference between the node Srb and the node Srs is V1−(V1−VTbg(Tm)_r)=VTbg(Tm)_r. That is, the voltage Vbgs_r is fixed to VTbg(Tm)_r by the capacitor C11, so that the transistor M1r is kept off.

To inhibit a change in the voltage Vbgs_r also at the temperature Tmax, the voltage VBGM1 is preferably sufficiently low.

(Period TT4)

In Period TT4, the signal MON2 at "H" is input to the monitor circuit 130 to turn on the transistor M12. The voltage VSSA is input to the node Srs. The voltage difference between the node Srb and the node Srs is fixed to VTbg(Tm)_r, so that the voltage Vrb becomes VTbg(Tm)_r+VSSA. The voltage Vrb is output from the terminal a6 as a voltage Vmon. The voltage VSSA is a power voltage and does not depend on the electrical characteristics of the transistor M1r; thus, obtaining the voltage Vmon of the terminal a6 corresponds to obtaining the threshold voltage VTbg(Tm)_r. For example, when the voltage VSSA is 0 V, the voltage Vmon becomes equal to the threshold voltage VTbg(Tm)_r.

The threshold voltages VTbg(Tm)_r and VTg(Tm)_r have the relation in Formula (1.3), and the transistor M1r is a replica transistor of the transistor M1. Thus, the use of the voltage Vmon can correct a change in the threshold voltage VTg and/or VTbg of the transistor M1 due to temperature.

The voltage output circuit 120 generates the voltage VOT1 based on the voltage Vmon. When the voltage VOT1 is used as a bias voltage input to the back gate of the transistor M1, for example, a change in the threshold voltage VTg of the transistor M1 due to temperature can be corrected. As another example, the "H" and/or "L" voltage of the gate voltage of the transistor M1 in the semiconductor device 110 is adjusted based on the voltage VOT1, whereby a change in the on-state current characteristics and the off-state current characteristics of the transistor M1 due to temperature can be corrected.

Figure 5A:
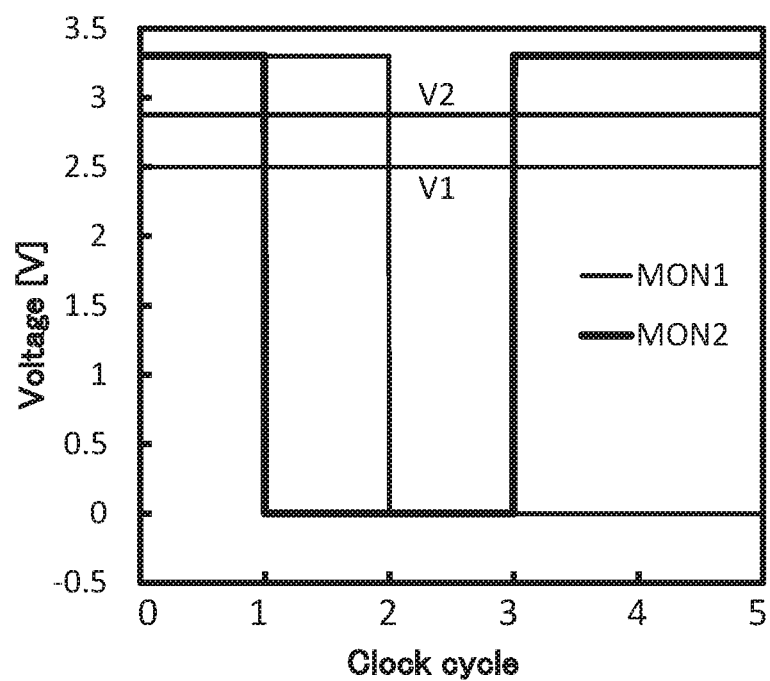
FIG. 5 A: Input waveforms of a monitor circuit in simulation. B: A diagram showing simulation results of the monitor circuit.
Figure 5B:
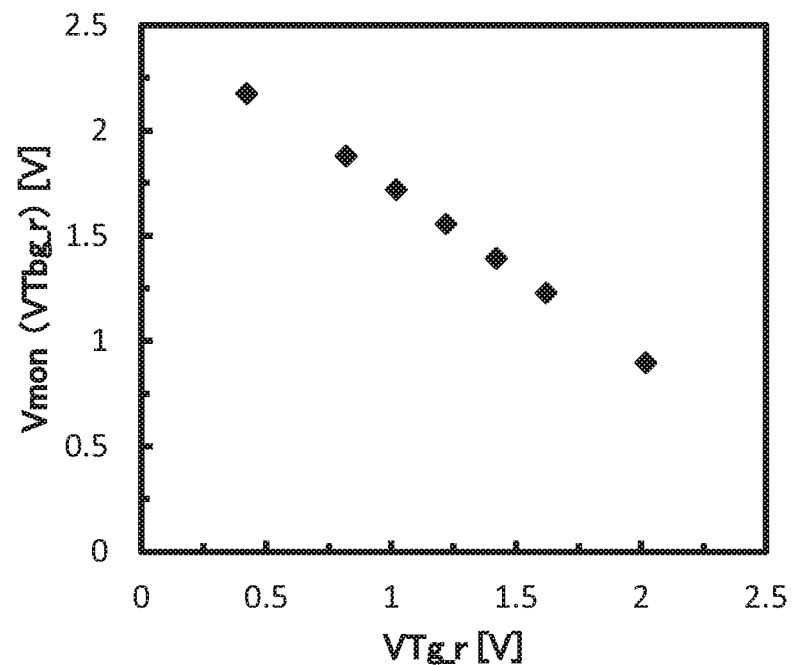

The operation of the monitor circuit 130 was verified by simulation. FIG. 5A is a timing chart of the monitor circuit 130 in the simulation. The voltages VSSA, VDDD, V1, and V2 are 0 V, 3.3 V, 2.5 V, and 2.9 V, respectively. The voltage VBGM1 is 0 V. Since the voltage VSSA is 0 V, the voltage Vmon becomes equal to a threshold voltage VTbg_r. On the assumption that only threshold voltages VTg_r and VTbg_r of the transistor M1r change depending on temperature, several voltage values were set for the threshold voltage VTg_r and the voltage Vmon with respect to each voltage value was calculated. FIG. 5B shows the simulation results showing a change in the voltage Vmon with respect to the threshold voltage VTg_r. FIG. 5B shows that a change in the threshold voltage VTg_r due to temperature can be monitored by obtaining the voltage Vmon.

The number of elements in the monitor circuit 130 is extremely small, so that the monitor circuit 130 can be easily provided close to the transistor M1. In this case, the electrical characteristics of the transistor M1 can be corrected more accurately. With the use of the monitor circuit 130, correction of the electrical characteristics of the transistor M1 can be performed in accordance with temperature without providing a temperature sensor. Therefore, with the use of the monitor circuit 130, penalties in area and energy of the semiconductor device 100 can be reduced even when a correction function of the threshold voltage of the transistor M1 in accordance with temperature is added to the semiconductor device 100. The monitor circuit 130 itself can be used as a temperature sensor.

Some variation examples of the semiconductor device 100 will be described below.

The transistors M11 and M12 are not limited to OS transistors. For example, n-channel or p-channel Si transistors can be used. Note that in the case where the transistors M11 and M12 are Si transistors, the off-state current characteristics of the transistors M11 and M12 are not sufficient; thus, when the operating frequency is too low, a change in the voltages Vrb and Vrs is not accepted in Periods TT3 and TT4. Meanwhile, in the case where the transistors M11 and M12 are OS transistors having an extremely low off-state current, a change in the voltages Vrb and Vrs can be inhibited, so that the operating frequency of the monitor circuit 130 needs not to be higher than necessary. Thus, dynamic power consumption of the monitor circuit 130 can be reduced.

The transistors M11 and M12 can each be a transistor with no back gate. In this case, when the transistors M11 and M12 are n-channel transistors, for example, "L" of the signals MON1 and MON2 may be set lower than VSSA in order to improve the off-state current characteristics of the transistors M11 and M12. When the transistors M11 and M12 are p-channel transistors, "H" of the signals MON1 and MON2 may be set higher than VDDA.

The transistor M1 can be a transistor with no back gate. In that case, a difference between the transistors M1$r$ and the transistor M1 is the existence of a back gate. By adjusting "H" and/or "L" voltage input to the gate of the transistor M1 using the voltage Vmon, a change in the on-state current characteristics and/or the off-state current characteristics of the transistor M1 can be corrected.

Figure 6:
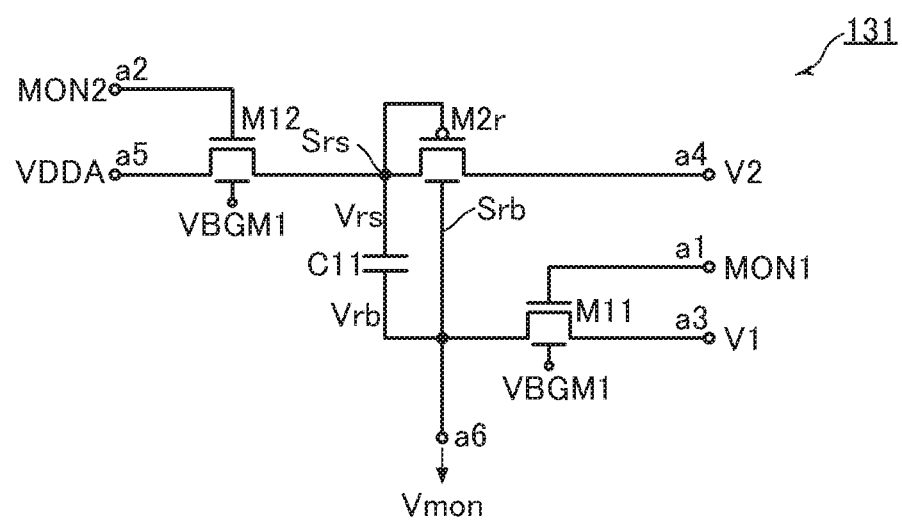
FIG. 6 A circuit diagram illustrating a configuration example of a monitor circuit.

The transistors M1 and M1$r$ are not limited to OS transistors and are not limited to n-channel transistors. For example, the transistors M1 and M1$r$ can be n-channel or p-channel Si transistors. FIG. 6 is a circuit diagram of a monitor circuit 131 using a p-channel transistor M2$r$ instead of the transistor M1$r$. Since the monitor circuit 131 has the same function as the monitor circuit 130, reference numerals of voltage and current that are the same as those for the monitor circuit 130 are used for the monitor circuit 131.

The voltage VDDA is input to the terminal a5. The voltages V1, V2, and Va are set so that the polarities of the voltages Vgs_r, Vbgs_r, and Vds_r and the drain current Id_r of the transistor M2$r$ are opposite to those of the transistor M1$r$. Specifically, the voltages V1, V2, and Va satisfy Formulae (2.4) to (2.6).

$$V1 < VTbg(Tmin)\_r \quad (2.4)$$

$$V2 = V1 - VTbg(Tmax)\_r + Va < VDDA \quad (2.5)$$

$$VTbg(Tmin)\_r - VTbg(Tmax)\_r + Va < 0 \quad (2.6)$$

The operation of the monitor circuit 131 will be described using the timing chart in FIG. 3B. Since the operation of the monitor circuit 131 is similar to that of the monitor circuit 130, the description is simplified.

(Period TT1)

The transistors M11 and M12 are on and the voltages VDDA and V1 are input to the nodes Srs and Srb. Since Formulae (2.4) to (2.6) are satisfied, the transistor M2$r$ shows normally-on characteristics. The voltage Vds_r is lower than 0 V. Thus, the drain current Id_r flows.

(Period TT2)

The node Srs is in an electrically floating state because the transistor M12 is off. The drain current Id_r flows, so that the voltage Vrs decreases. Then, the voltage Vrs converges to V1−VTbg(Tm)_r and the drain current Id_r stops flowing. Since Formulae (2.4) to (2.6) are satisfied, even in the state where the voltage Vrs converges to V1−VTbg(Tm)_r, the voltage Vds_r is lower than 0 V in the operating temperature range.

(Period TT3)

The transistor M11 is turned off, whereby the nodes Srs and Srb are brought into an electrically floating state. The voltage Vbgs_r is fixed to VTbg(Tm)_r by the capacitor C11, so that the transistor M2$r$ is kept off.

(Period TT4)

The transistor M12 is turned on, and the voltage VDDA is input to the node Srs. The voltage difference between the node Srb and the node Srs is fixed to VTbg(Tm)_r, so that the voltage Vrb becomes VTbg(Tm)_r+VDDA. The voltage Vrb is output from the terminal a6 as the voltage Vmon. The voltage VDDA is a power voltage and does not depend on the electrical characteristics of the transistor M2$r$, thus, the threshold voltage VTbg(Tm)_r can be obtained from the voltage Vmon of the terminal a6.

<<Semiconductor Device 101>>

Figure 7:
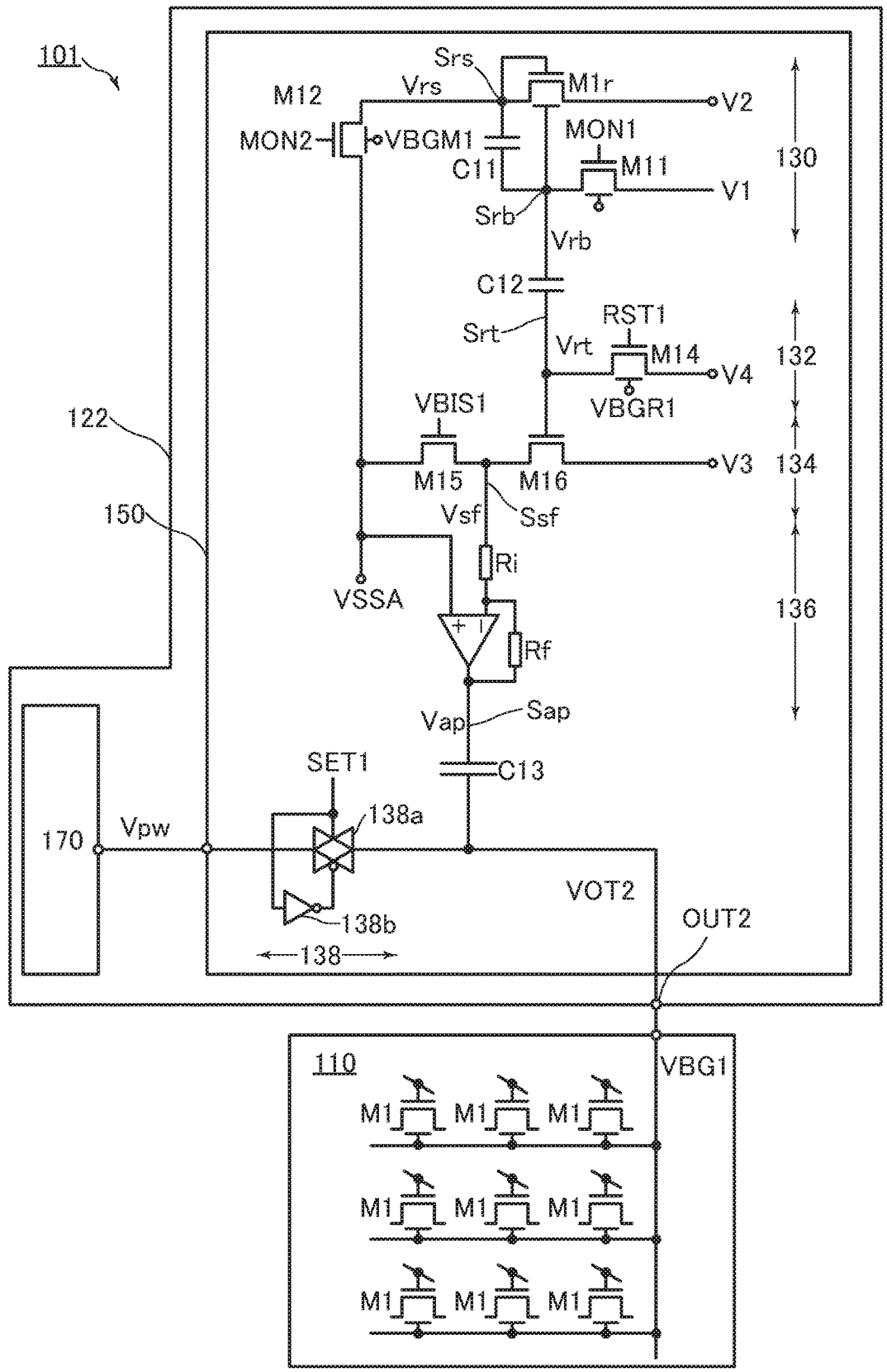
FIG. 7 A circuit diagram illustrating a configuration example of a semiconductor device.

A semiconductor device 101 illustrated in FIG. 7 includes the semiconductor device 110 and a voltage output circuit 122. The voltage output circuit 122 includes a voltage correction circuit 150, a voltage generation circuit 170, and an output terminal OUT2. The voltage generation circuit 170 outputs a voltage Vpw. The voltage correction circuit 150 corrects the voltage Vpw and generates a voltage VOT2. The output terminal OUT2 outputs the voltage VOT2. The voltage VOT2 is used as a voltage VBG1 input to the back gate of the transistor M1 in the semiconductor device 110.

<Voltage Correction Circuit 150>

The voltage correction circuit 150 includes the monitor circuit 130, capacitors C12 and C13, a reset circuit 132, a source follower circuit 134, an operational amplifier 136, and a switch circuit 138. A first terminal and a second terminal of the capacitor C12 are electrically connected to the output terminal (the node Srb) of the monitor circuit 130 and an input terminal of the source follower circuit 134, respectively. Here, nodes corresponding to the input terminal and an output terminal of the source follower circuit 134 are referred to as nodes Srt and Ssf, respectively.

The reset circuit 132 is a circuit for resetting the node Srt and includes a transistor M14. Here, the transistor M14 is an OS transistor having a back gate. A source of the transistor M14 is electrically connected to the node Srt, and a signal RST1, a voltage VBGR1, and a voltage V4 are input to a gate, the back gate, and a drain, respectively.

The source follower circuit 134 includes transistors M15 and M16 electrically connected to each other in series. Here, the transistors M15 and M16 are n-channel Si transistors. Voltages VBIS1 and VSSA are input to a gate and a source of the transistor M15, respectively. A gate of the transistor M16 corresponds to the node Srt. A voltage V3 is input to a drain of the transistor M16.

An inverting input terminal of the operational amplifier 136 is electrically connected to the node Ssf, and the voltage VSSA is input to a non-inverting input terminal. A node Sap corresponds to an output terminal of the operational amplifier. Ri and Rf are input resistance and feedback resistance, respectively. A transistor of the operational amplifier 136 is a Si transistor, for example.

A first terminal and a second terminal of the capacitor C13 are electrically connected to the node Sap and the output terminal OUT2, respectively. The capacitor C13 retains the voltage VOT2 of the output terminal OUT2.

The switch circuit 138 controls electrical connection between an output terminal of the voltage generation circuit 170 and the output terminal OUT2. The switch circuit 138 includes, for example, an analog switch circuit 138a and an inverter circuit 138b. A signal SET1 controls the on/off of the analog switch circuit 138a. The analog switch circuit 138a and the inverter circuit 138b are formed using Si transistors, for example.

<Voltage Generation Circuit 170>

Figure 8:
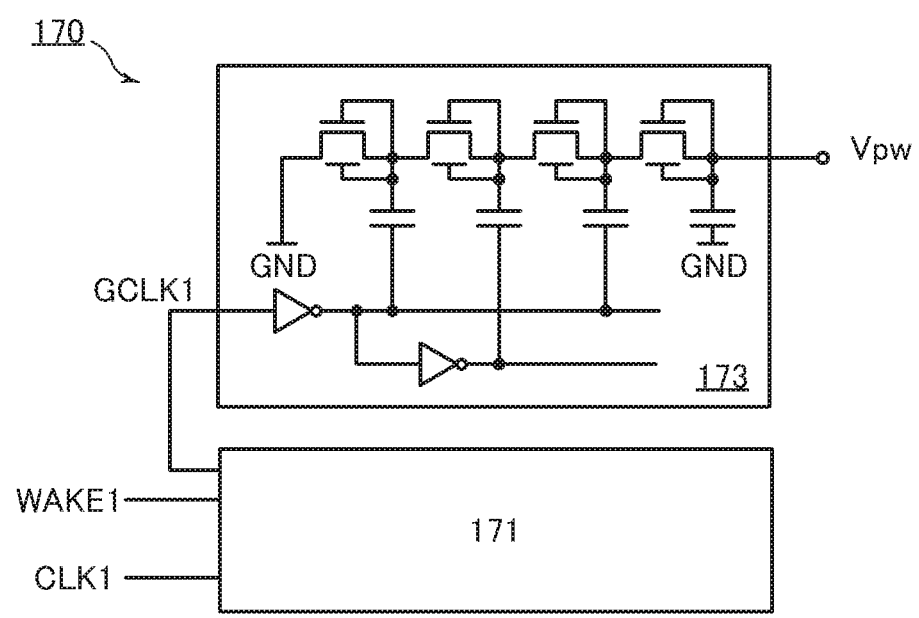
FIG. 8 A circuit diagram illustrating a configuration example of a voltage generation circuit.

FIG. 8 illustrates an example of the voltage generation circuit 170. The voltage generation circuit 170 includes a control circuit 171 and a charge pump circuit 173.

The control circuit 171 generates a gated clock signal GCLK1 (hereinafter, referred to as a clock signal GCLK1) in accordance with a signal WAKE1 and a clock signal CLK1. The clock signal GCLK1 is input to the charge pump circuit 173. When the clock signal GCLK1 is active, the charge pump circuit 173 operates.

The charge pump circuit 173 illustrated in FIG. 8 is a four-stage step-down charge pump circuit and generates the voltage Vpw from GND. The charge pump circuit 173 includes two inverter circuits, four diode-connected transistors, and four capacitors. The transistor is an OS transistor having a back gate, and the back gate and a drain are electrically connected to each other.

The transistor of the charge pump circuit 173 may be an OS transistor with no back gate. It is needless to say that the transistor may be an n-channel or p-channel Si transistor without limitation to an OS transistor. Note that the on-state current/off-state current ratio of an OS transistor is higher than that of a Si transistor; thus, the OS transistor is suitable for the charge pump circuit 173.

In the case where the voltage Vpw can be set to GND or the voltage VSSA, for example, the voltage generation circuit 170 is not provided in the voltage output circuit 122 and GND or the voltage VSSA is input to the voltage correction circuit 150 as the voltage Vpw.

Operation Example of Voltage Output Circuit 122

Figure 9:
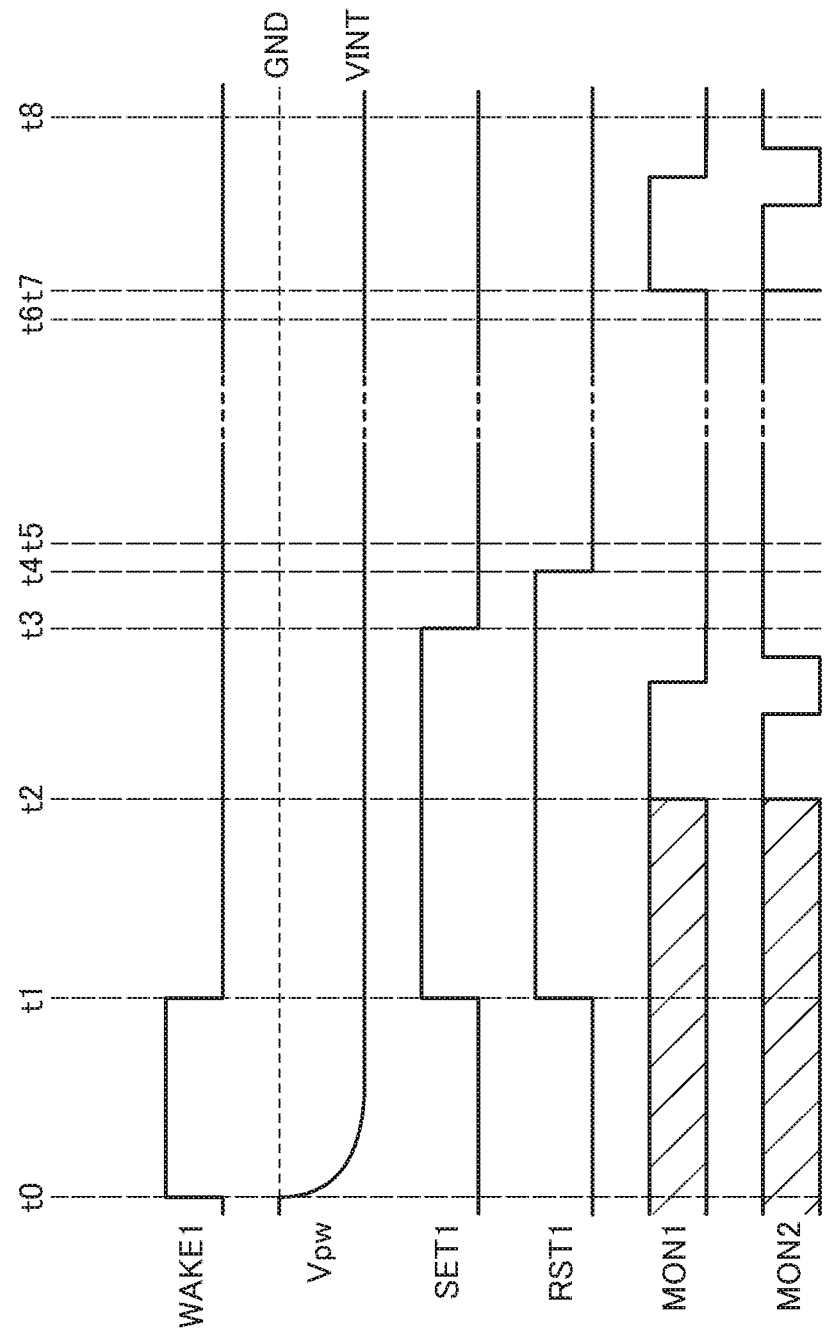
FIG. 9 A timing chart showing an operation example of a semiconductor device.

An operation example of the voltage output circuit 122 will be described with reference to FIG. 7 to FIG. 9. In FIG. 9, t0 to t8 each represent time. Note that temperature Tm from t0 to t5 is Tp1, and the temperature Tm from t6 to t8 is Tp2.

From t0 to t1, the signal WAKE1 is at "H", so that the control circuit 171 generates an active clock signal GCLK1. The charge pump circuit 173 performs step-down operation. The voltage Vpw decreases and then reaches a voltage VINT. The transistor M1 of the semiconductor device 101 is not operated. At Time t1, the signal WAKE1 becomes "L" and the charge pump circuit 173 stops step-down operation.

At Time t1, the signals RST1 and SET1 are set to "H" to initialize the node Srt and the output terminal OUT2. The voltages V4 and VINT are input to the node Srt and the output terminal OUT2, respectively. The voltage V4 is, for example, VDDA/2.

From t2 to t3, the monitor circuit 130 is operated while the signals SET1 and RST1 are fixed to "H", and a threshold voltage VTbg_r(Tp1) is obtained. The voltage Vrb is VTbg_r(Tp1)+VSS. The voltages of the signals MON1 and MON2 are not fixed.

At Time t3, the signal SET1 is set to "L" to stop the input of the voltage VINT to the output terminal OUT2.

At Time t4, the signal RST1 is set to "L" to turn off the transistor M14. The node Srt is brought into an electrically floating state, whereby current corresponding to the amount of charge of the capacitor C12 flows through the node Srt. The source follower circuit 134 converts the current flowing through the node Srt into a voltage. The amount of charge of the capacitor C12 depends on the voltage Vrb=VTbg_r(Tp1)+VSS, so that a voltage Vsf depends on the threshold voltage VTbg_r(Tp1).

As described above, in the case where the relation between the threshold voltage VTbg_r and the threshold voltage VTg_r is represented by a linear function and the relation between the threshold voltage VTg_r and a back gate voltage Vbg_r is represented by a linear function, the threshold voltages of the transistors M14 and M15 and the voltages V4 and VBIS1 are preferably set so that the input/output characteristics of the source follower circuit 134 are linear in the operating temperature range.

The operational amplifier 136 amplifies the voltage Vsf and generates a voltage Vap. Therefore, the voltage Vap depends on the threshold voltage VTbg_r(Tp1). Since the switch circuit 138 is off, the voltage VOT2 changes in accordance with the voltage Vap, the capacitance of the capacitor C13, and the parasitic capacitance of the output terminal OUT2 and becomes VINT+ΔVout2(Tp1). The voltage ΔVout2(Tp1) is a correction voltage for the voltage VOT2 at the temperature Tp1. The voltage VINT, the specifications of the source follower circuit 134 (e.g., the threshold voltages of M15 and M16 and the voltage V4), the specifications of the operational amplifier 136 (e.g., gain and the resistance values of Rf and Ri), the capacitance values of the capacitors C12 and C13, and the like are set so that VINT+ΔVout2(Tm) becomes equal to a back gate voltage Vbg_r(Tm).

In the case where the voltage VINT is the back gate voltage Vbg(Tref) of the transistor M1 at the reference temperature Tref, ΔVout2(Tm) is ΔVout2(Tm)=Vbg(Tm)−Vbg(Tref)=Vbg_r(Tm)−Vbg_r(Tref), for example.

ΔVout2(Tm) depends on the output voltage Vrb of the monitor circuit 130. As the temperature Tm rises, the voltage Vrb increases. To correct a change in the threshold voltage VTg of the transistor M1, ΔVout2(Tm) is decreased when the temperature Tm rises, and ΔVout2(Tm) is increased when the temperature Tm falls. From the above, the operational amplifier 136 is composed of an inverting amplifier circuit.

After Time t4, the voltage VOUT2 is changed from VINT and then becomes stable at Vbg(Tp1). After the voltage VOUT2 becomes stable, the operation of the transistor M1 is started at Time t5. In a period from t5 to t6, the voltage Vbg(Tp1) is input to the back gate of the transistor M1.

After a certain period has passed after Time t2, the monitor circuit 130 is operated and the threshold voltage VTbg_r(Tm) is obtained again. First, the operation of the transistor M1 is stopped at Time t6. In a period from t7 to t8, a threshold voltage VTbg_r(Tm2) is obtained by the monitor circuit 130. When the voltage Vrb is fixed to VTbg_r(Tm2)+VSS, the voltage VOUT2 becomes stable at Vbg(Tm2). After the voltage VOUT2 becomes stable, the operation of the transistor M1 is resumed at Time t8. After Time t8, the operation from Time t5 to t8 is repeated. For example, after the operation from t5 to t8 is performed a predetermined number of times, the operation from t0 to t6 may be executed.

As described above, by obtaining the threshold voltage VTbg_r(Tm) by the monitor circuit 130 regularly, a voltage appropriate for the operating temperature can be input to the back gate of the transistor M1. As a result, a change in the threshold voltage VTg of the transistor M1 due to temperature can be corrected regularly.

<<Semiconductor Device 102>>

Figure 10:
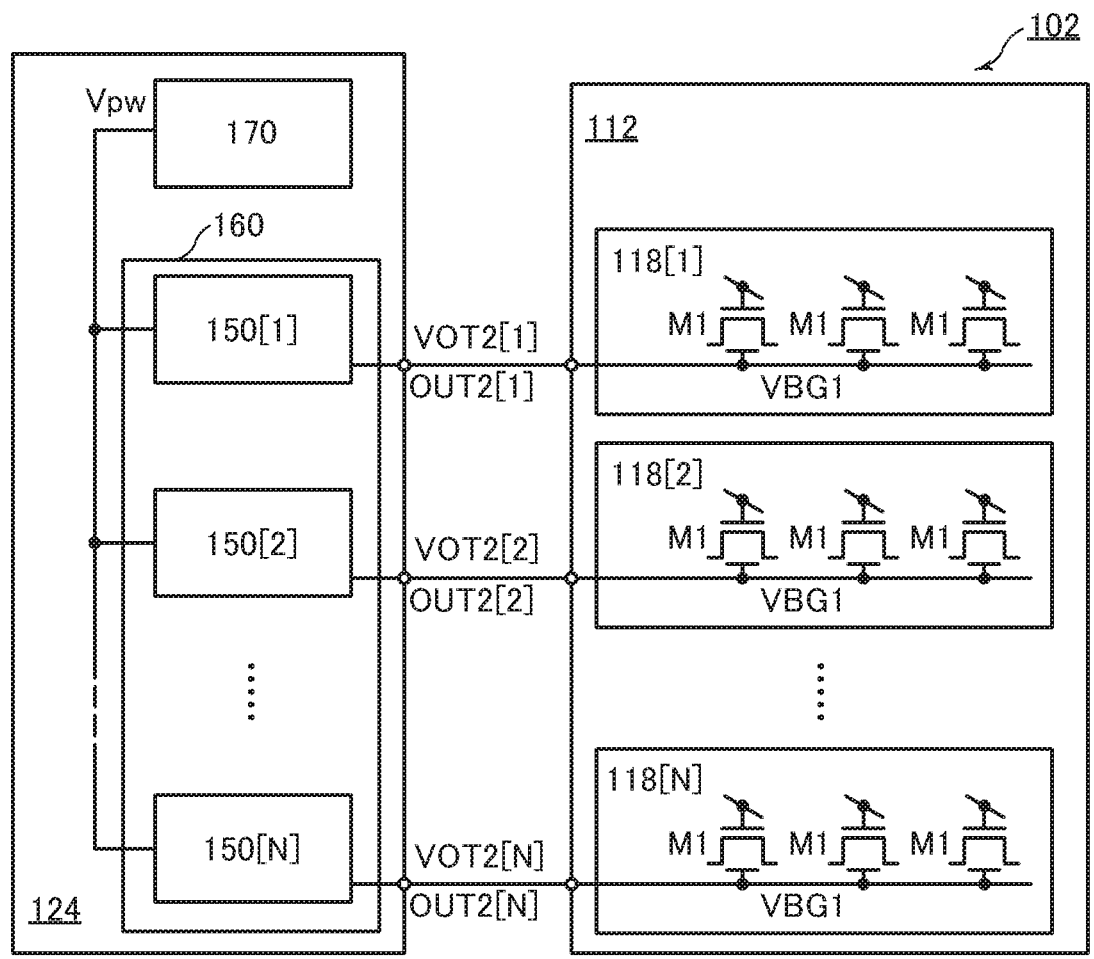
FIG. 10 A functional block diagram illustrating a structure example of a semiconductor device.

A semiconductor device 102 illustrated in FIG. 10 includes a semiconductor device 112 and a voltage output circuit 124. The semiconductor device 112 includes N (N is an integer of 1 or more) power domains 118[1] to 118[N] supplied with the voltage VBG1. The transistors M1 are provided in the power domains 118[1] to 118[N]. The output circuit 124 includes the voltage generation circuit 170, a voltage correction circuit 160, and N output terminals OUT2[1] to OUT2[N]. The correction circuit 160 includes N voltage correction circuits 150[1] to 151[N]. The voltage generation circuit 170 supplies the voltage Vpw to each of the voltage correction circuits 150[1] to 151[N]. The voltage correction circuits 150[1] to 150[N] correct voltages VOT2[1] to VOT2[N] of the output terminals OUT2[1] to OUT2[N].

<<Semiconductor Device 103>>

Figure 11:
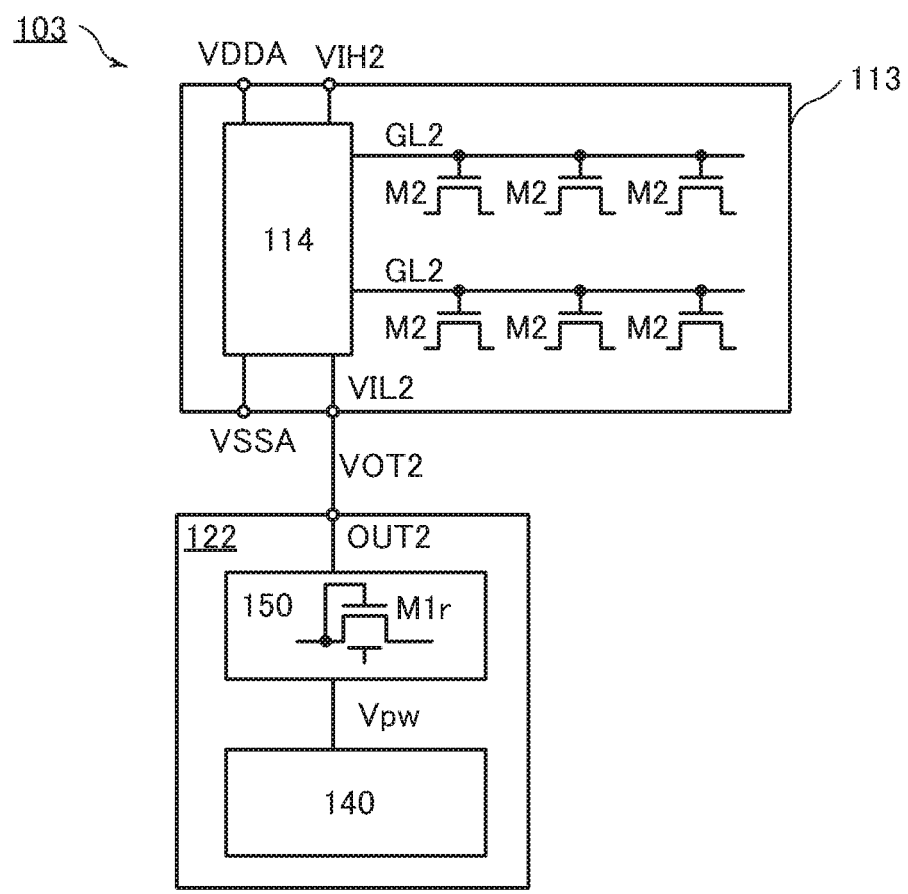
FIG. 11 A functional block diagram illustrating a structure example of a semiconductor device.

A semiconductor device 103 illustrated in FIG. 11 includes a semiconductor device 113 and the voltage output circuit 122. The semiconductor device 113 includes a driver circuit 114, a wiring GL2, and a transistor M2. A gate of the transistor M2 is electrically connected to the wiring GL2.

Voltages VDDA, VIH2, VSSA, and VIL2 are input to the driver circuit 114. The voltages VDDA and VSSA are power supply voltages. The output voltage VOT2 of the voltage output circuit 122 is used as the voltage VIL2 in the driver circuit 114. Note that in the case where N power domains supplied with the voltage VIL2 are included in the semiconductor device 112, the voltage output circuit 124 illustrated in FIG. 10 is used.

The voltage correction circuit 150 corrects "L" of the wiring GL2 in accordance with temperature. For example, VINT is set to VIL2(Tref) at the reference temperature Tref. The difference between the transistor M1r and the transistor M2 is the existence of a back gate. Note that the transistor M2 may have a back gate. In this case, the back gate inputs a constant voltage. The back gate is electrically connected to any one of a gate, a source, and a drain.

Figure 12A:
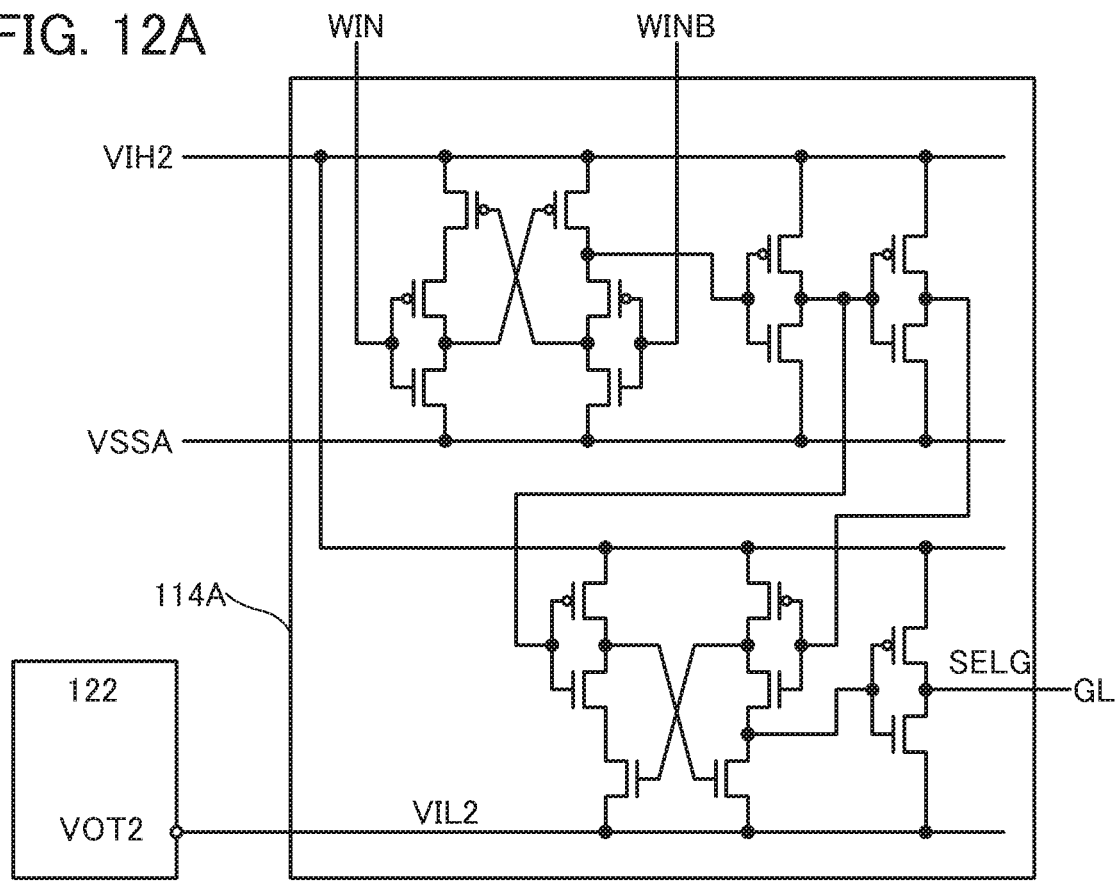
FIG. 12 A: A circuit diagram illustrating a configuration example of a circuit. B: A timing chart showing an operation example of the circuit.

The driver circuit 114 includes a circuit 114A illustrated in FIG. 12A. The circuit 114A generates a signal SELG for selecting a wiring GL. The voltages VIH2, VIL2, and VSSA and signals WIN and WINB are input to the circuit 114A. The signal WINB is an inverted signal of the signal WIN.

Figure 12B:
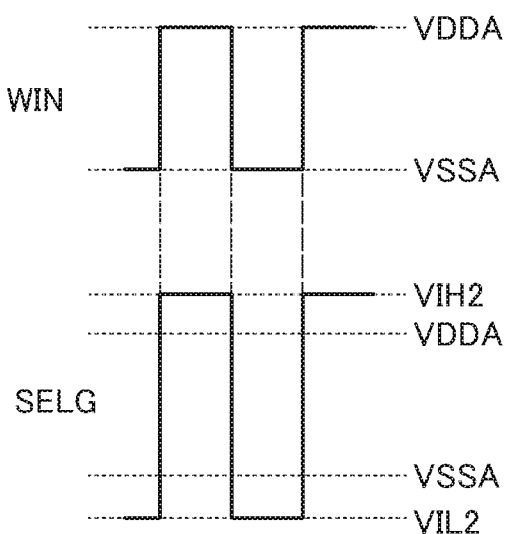

FIG. 12B shows a timing chart of the circuit 114A. The circuit 114A outputs the signal SELG at "H" to the wiring GL when the signal WIN is at "H", and outputs the signal SELG at "L" to the wiring GL when the signal WIN is at "L". "H" and "L" of the signals WIN and WINB are the voltages VDDA and VSSA, respectively. "H" and "L" of the signal SELG are the voltages VIH2 and VIL2, respectively. The circuit 114A is used as a level shifter for shifting the level of the signal WIN.

Since the voltage VIL2 is adjusted by the voltage output circuit 122, the voltage VIL2 decreases as the temperature rises. Thus, even when the threshold voltage VTg of the transistor M2 decreases due to temperature rise, an increase in the off-state current of the transistor M2 can be canceled by decreasing the voltage VIL2.

The semiconductor device 103 may be provided with a voltage output circuit for adjusting the voltage VIH2. In this case, an operational amplifier of the voltage output circuit is preferably composed of a non-inverting amplifier circuit. Even when the threshold voltage VTg of the transistor M2 increases due to temperature fall, a decrease in the on-state current of the transistor M2 can be canceled because the voltage VIH2 can be increased.

Embodiment 2

In this embodiment, a semiconductor device using an OS transistor will be described.

<Memory Device 200>

Figure 13A:
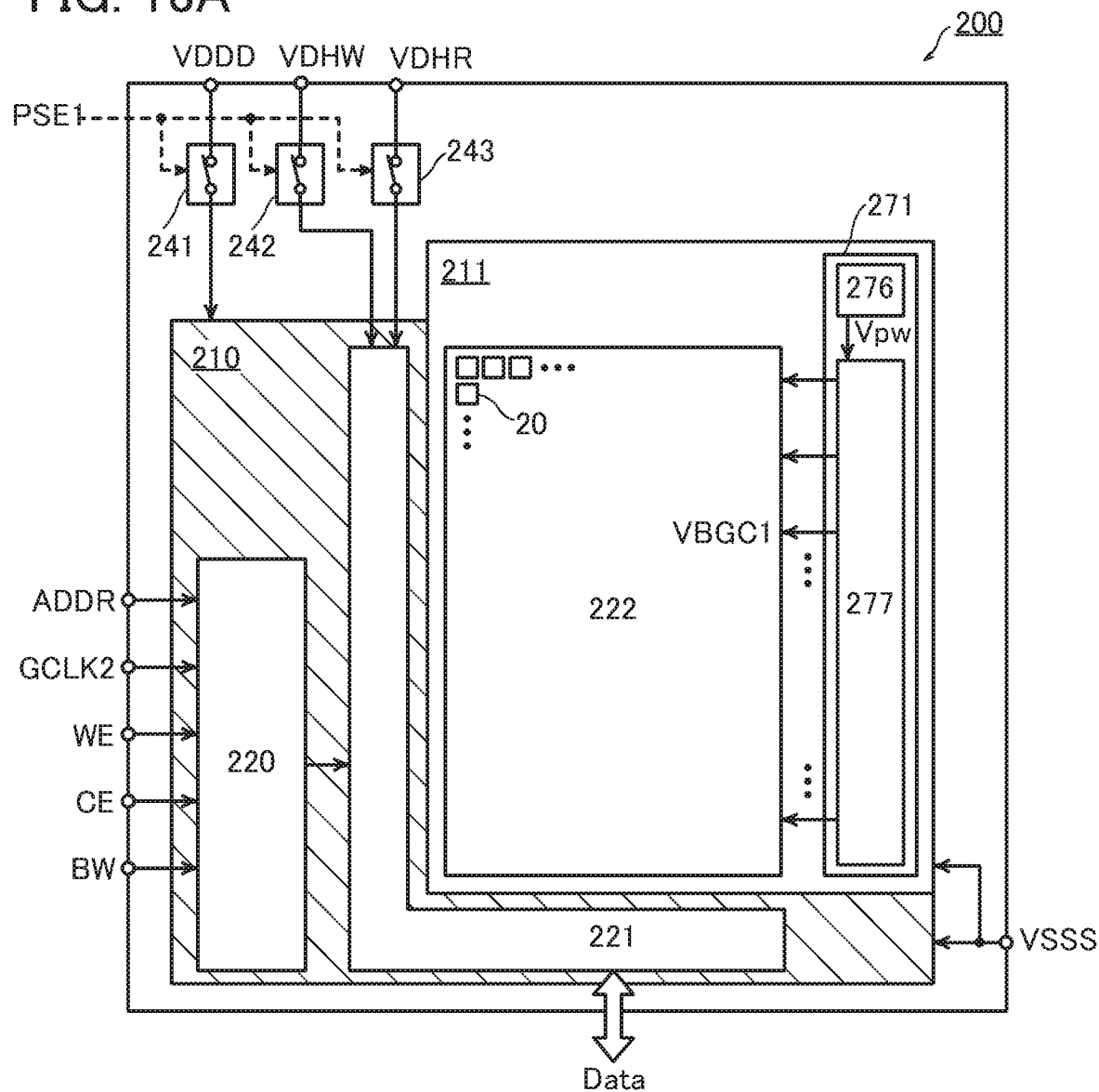
FIG. 13 A: A functional block diagram illustrating a configuration example of a memory device. B: A circuit diagram illustrating a configuration example of a memory cell array.

A memory device 200 illustrated in FIG. 13A includes power domains 210 and 211 and power switches 241 to 243. A control circuit 220 and a peripheral circuit 221 are provided in the power domain 210. A memory cell array 222 and a voltage output circuit 271 are provided in the power domain 211.

Voltages VDDD, VSSS, VDHW, and VDHR, a clock signal GCLK2, an address signal ADDR, a signal PSE1, and command signals (e.g., a chip enable signal CE, a write enable signal WE, and a byte write enable signal BW) are input to the memory device 200. Note that the voltages, the signals, and the like input to the memory device 200 are appropriately selected in accordance with the circuit configuration, the operation method, and the like of the memory device 200.

The control circuit 220 controls the whole memory device 200 collectively and performs data writing and data reading. The control circuit 220 processes the address signal ADDR and a command signal from the outside and generates a control signal for the peripheral circuit 221.

The signal PSE1 controls the on/off of the power switches 241 to 243. The signal PSE1 is transmitted from a PMU (power management device), for example. The power switches 241 to 243 control input of the voltages VDDD, VDHW, and VDHR, respectively, to the power domain 210. In a period in which the control circuit 220 and the peripheral circuit 221 need not to be operated, the power switches 241 to 243 are turned off to perform power gating of the power domain 210.

Figure 13B:
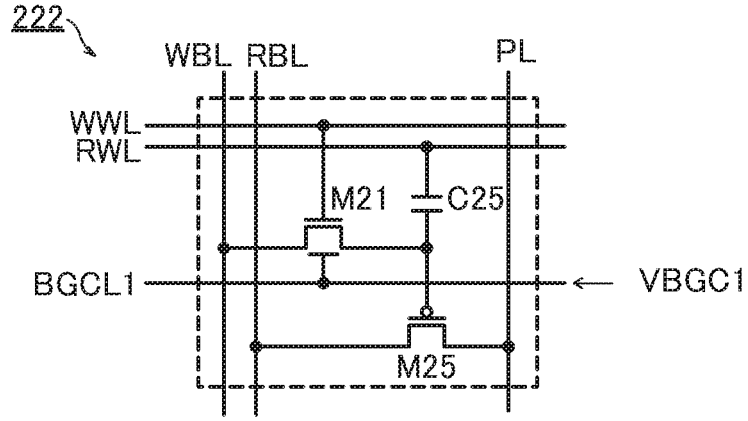

FIG. 13B illustrates a circuit diagram of the memory cell array 222. The memory cell array 222 includes a memory cell 20, a write word line WWL, a read word line RWL, a write bit line WBL, a read bit line RBL, and wirings PL and BGCL1. The wiring BGCL1 is electrically connected to the voltage output circuit 271. The voltages VDDD and VSSS are voltages representing data "1" and "0", respectively. Voltages VDHW and VHDR are voltages representing the "H" voltages of the write word line WWL and the read word line RWL, respectively.

The peripheral circuit 221 has a function of selecting the memory cell 20 specified by the address signal ADDR, for example. Specifically, the peripheral circuit 221 has a function of selecting the write word line WWL and the read word line RWL in a selected row, a function of writing data to the write bit line WBL in a column specified by the address signal ADDR, and a function of reading data from the read bit line RBL in the column.

The memory cell 20 is a 2T1C (two transistors and one capacitor) gain cell, which includes transistors M21 and M25 and a capacitor C25. The capacitor C25 is a storage capacitor for retaining the gate voltage of the transistor M25. The transistors M21 and M25 are a write transistor and a read transistor, respectively. The transistor M21 is an OS transistor having a back gate, and the transistor M25 is a p-channel Si transistor. The transistor M25 can be an n-channel Si transistor or an n-channel OS transistor. When the transistors M21 and M25 are OS transistors, the memory cell array 222 can be stacked over the control circuit 220 and the peripheral circuit 221, so that the memory device 200 can be downsized.

The voltage output circuit 124 is used as the voltage output circuit 271. The voltage output circuit 271 includes a voltage generation circuit 276 and a voltage correction circuit 277. The voltage generation circuit 276 lowers the voltage VSSS and generates the voltage Vpw. The voltage correction circuit 277 is provided with a replica transistor of the transistor M21. The voltage VOT2 generated by the voltage correction circuit 277 is input to the wiring BGCL1 as a voltage VBGC1.

Note that the voltage generation circuit 276 may be provided outside the memory device 200. In the case where the voltage VSSS can be used as the voltage Vpw, the voltage generation circuit 276 is not necessarily provided. The driver circuit 114 illustrated in FIG. 11 may be used as a circuit of the peripheral circuit 221 that generates a signal for selecting the write word line WWL, for example. In that case, the voltage output circuit 271 may be omitted and a constant voltage may be input from the outside as the voltage VBGC1.

The memory cell 20 does not have a limit on the number of times of data rewriting in principle, can perform data rewriting with low energy, and does not consume power in retaining data. Since the transistor M21 is an OS transistor with an extremely low off-state current, the memory cell 20 can retain data for a long time. However, a change in the threshold voltage VTg of the transistor M21 changes writing time and retention time of the memory cell 20. The threshold voltage VTg decreases as the temperature rises, so that the retention time becomes short. On the other hand, the threshold voltage VTg increases as the temperature falls, so that the writing time becomes long.

The voltage VBGC1 appropriate for the operating temperature can be input to the back gate of the transistor M21 by the voltage output circuit 271; thus, a change in the threshold voltage VTg of the transistor M21 due to temperature can be corrected. For example, in the operating temperature range, the memory device 200 can achieve substantially the same performance as that at the reference temperature Tref. Since the memory cell array 222 in the example in FIG. 13A is divided into a plurality of blocks to which the voltage VBGC1 is input, variation in the performance of the memory cells 20 due to process can be corrected by providing a monitor circuit close to the memory cell array 222. Thus, the memory device 200 with high retention characteristics, a long lifetime, low power consumption, and high reliability can be provided.

Figure 14A:
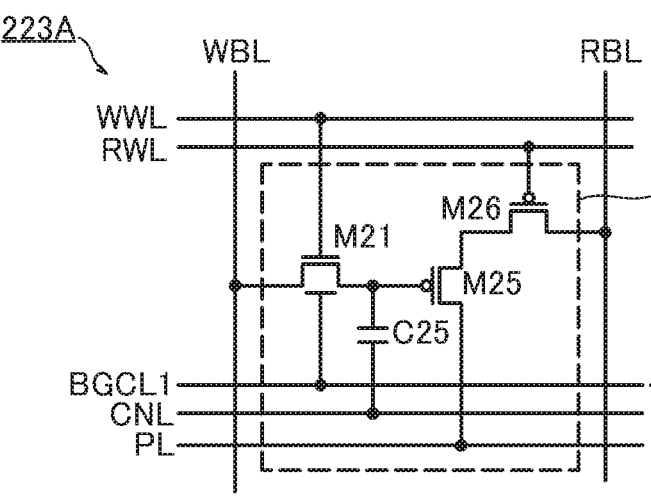
FIG. 14 A to D: Circuit diagrams illustrating configuration examples of memory cell arrays.

Other configuration examples of the memory cell array 222 are described below. A memory cell array 223A illustrated in FIG. 14A includes a memory cell 21, the write word line WWL, the read word line RWL, the write bit line WBL, the read bit line RBL, and wirings PL, CNL, and BGCL1. The memory cell 21 is a 3T gain cell including the transistors M21, M25, and M26, and the capacitor C25. The transistor M26 is a selection transistor. The transistors M25 and M26 may be n-channel Si transistors or n-channel OS transistors.

Figure 14B:
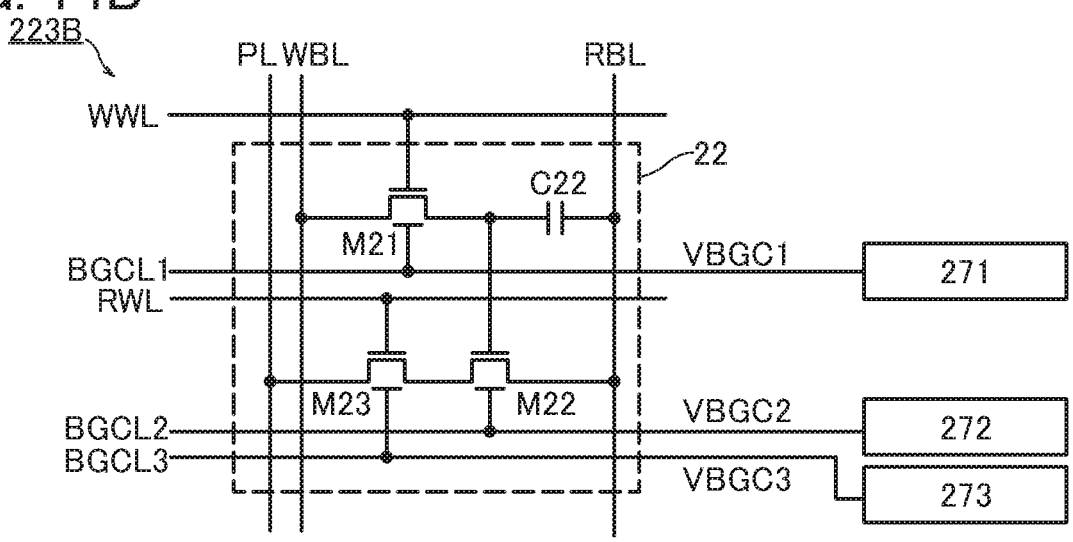

A memory cell array 223B illustrated in FIG. 14B includes a memory cell 22, the write word line WWL, the read word line RWL, the write bit line WBL, the read bit line RBL, and wirings PL and BGCL1 to BGCL3. The memory cell 22 includes transistors M21 to M23 and a capacitor C22. The transistors M22 and M23 are a write transistor and a selection transistor, respectively. The capacitor C22 is a storage capacitor for retaining the gate voltage of the read transistor M22.

The transistors M22 and M23 are OS transistors having back gates. The back gates of the transistors M22 and M23 are electrically connected to the wirings BGCL2 and BGCL3, respectively. A voltage VBGC2 is input from a voltage output circuit 272 to the wiring BGCL2, and a voltage VBGC3 is input from a voltage output circuit 273 to the wiring BGCL3. The voltage output circuits 272 and 273 each have a structure similar to that of the voltage output circuit 271 and are provided in a power domain 212. Replica transistors of the transistors M22 and M23 are provided in the voltage output circuits 272 and 273, respectively.

Since a gate of the transistor M22 and the read bit line RBL are capacitively coupled with each other, when the data "1" is read, a bootstrap effect is obtained and charging of the read bit line RBL is accelerated. That is, reading time can be shortened.

The threshold voltages VTg of the transistors M21 to M23 can be optimized by the voltages VBGC1 to VBGC3, respectively. To lengthen the retention time, the threshold voltage VTg of the transistor M21 is set highest. To increase the reading speed, VTg of the transistor M22 is decreased and the on-state current characteristics are improved. In that case, an increase in leakage current from the non-selected memory cell 22 to the read bit line RWL causes problems. Leakage current from the non-selected memory cell 22 leads to not only shortened data retention time but also data reading errors. Therefore, the off-state current characteristics are preferably prioritized over the on-state current characteristics in the transistor M23. Thus, VTg of the transistor M23 is set to be lower than VTg of the transistor M22. VBGC1 to VBGC3 are preferably VBGC1≤VBGC3< VBGC2.

A structure in which correction in accordance with temperature is not performed on part of the voltages VBGC1 to VBGC3 may be employed. For example, a constant voltage is input to the wiring BGCL3, the voltages of wirings BGCL1 and BGDL2 are corrected by the voltage output circuits 271 and 272.

Figure 14C:
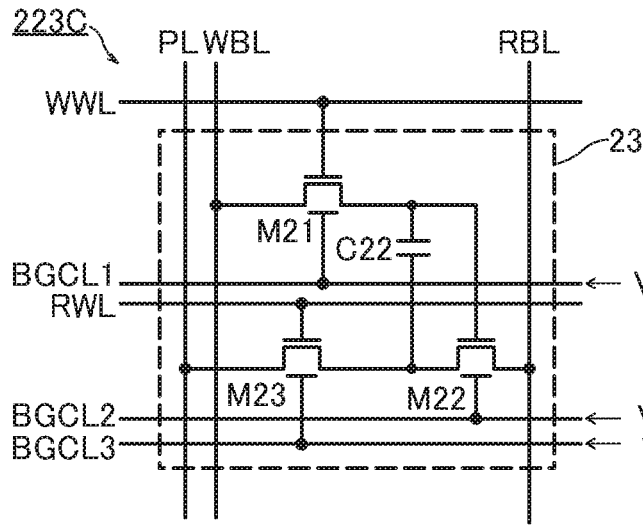

A memory cell array 222C illustrated in FIG. 14C is a variation example of the memory cell array 223B and includes a memory cell 23, the write word line WWL, the read word line RWL, the write bit line WBL, the read bit line RBL, the wirings PL, BGCL1, and BGCL2. The memory cell 23 is different from the memory cell 22 in connection of the capacitor C22. The memory cell 23 has a feature similar to that of the memory cell 22.

Figure 14D:
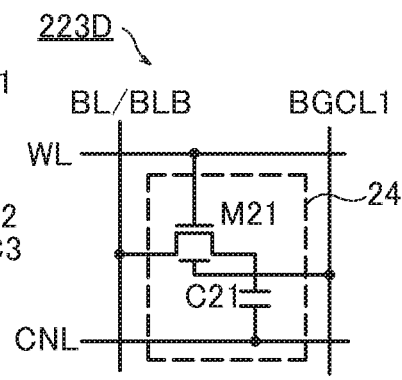

A memory cell array 223D illustrated in FIG. 14D includes a memory cell 24, bit lines BL and BLB, a word line WL, and the wirings CNL and BGCL1. The memory cell 23 is a 1T1C cell and includes the transistor M21 and a capacitor C21.

The memory cell arrays 223B to 223D are composed of OS transistors and capacitors and thus can be stacked over the control circuit 220 and the peripheral circuit 221.

<Memory Device 202>

Figure 15:
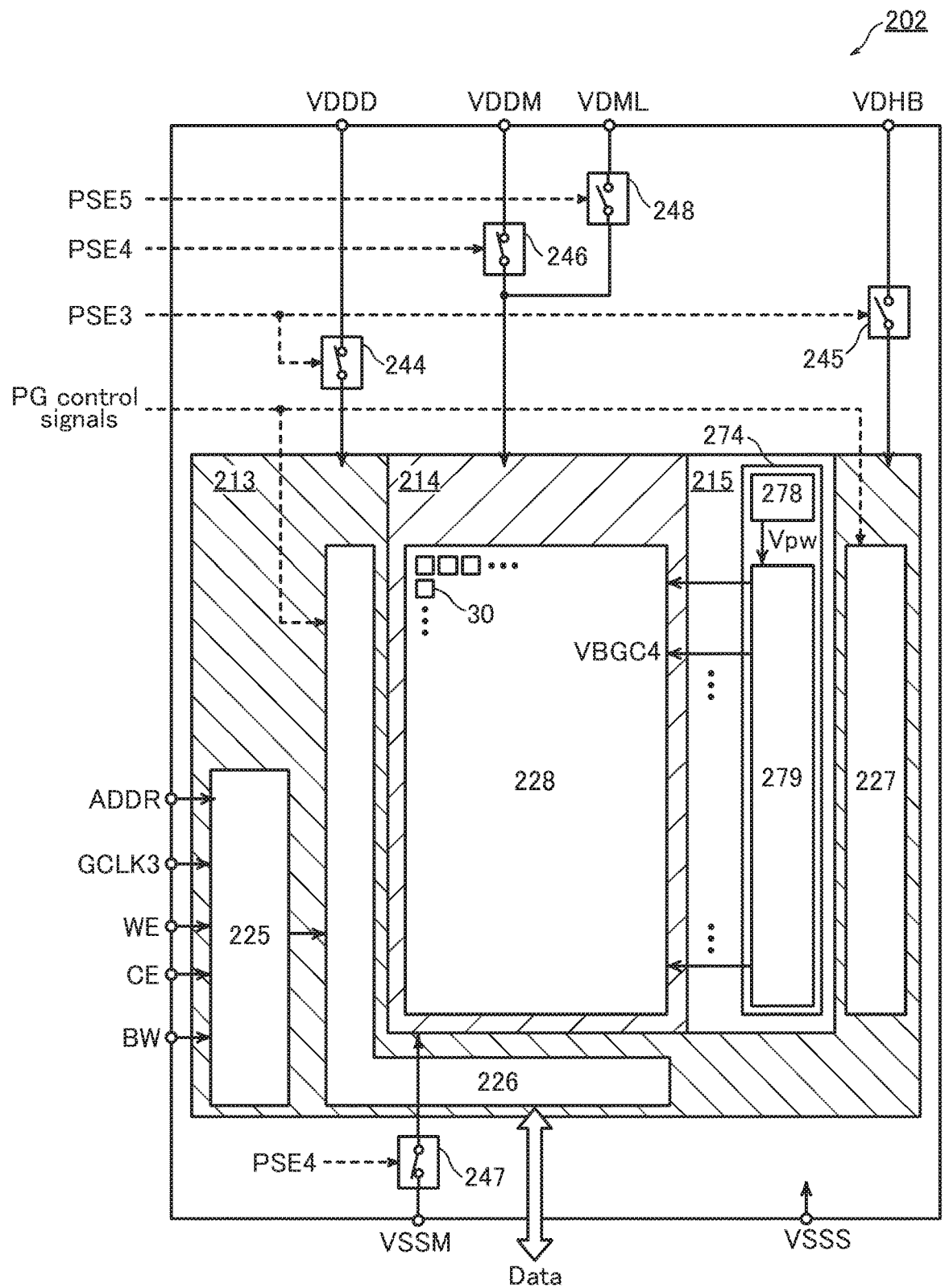
FIG. 15 A functional block diagram illustrating a configuration example of a memory device.

A memory device 202 illustrated in FIG. 15 includes power domains 213 to 215 and power switches 244 to 248. To the memory device 202, voltages VDDD, VSSS, VDDM, VDML, and VSSM, the address signal ADDR, a clock signal GCLK3, command signals (e.g., the chip enable signal CE, the write enable signal WE, and the byte write enable signal BW), signals PSE3 to PSE5, and PG (power gating) control signals (denoted by PG control signals in the drawing) are input. The voltages, the signals, and the like input to the memory device 202 are appropriately selected in accordance with the circuit configuration, the operation method, and the like.

The signal PSE3 controls the on/off of the power switches 244 and 245. The power switches 244 and 245 control supply of the voltages VDDD and VDHB to the power domain 213, respectively. A control circuit 225, a peripheral circuit 226, and a backup control circuit 227 are provided in the power domain 213. The signal PSE4 controls the on/off of the power switches 246 and 247, and the signal PSES controls the on/off of the power switch 248. The power switches 246 to 248 control supply of the voltages VDDM, VS SM, and VDML to the power domain 214, respectively. A memory cell array 228 is provided in the power domain 214. The memory cell array 228 includes a plurality of memory cells 30.

In the power domain 215, power gating is not performed. A voltage output circuit 274 is provided in the power domain 215. The voltage output circuit 274 has a structure similar to that of the voltage output circuit 271, and includes a voltage generation circuit 278 and a voltage correction circuit 279. The voltage VOT2 generated by the voltage correction circuit 279 is input to the memory cell array 228 as a voltage VBGC4.

(Memory Cell Array 228)

The memory cell array 228 illustrated in FIG. 15 includes the memory cell 30, the word line WL, the bit lines BL and BLB, and wirings OGL, BGCL4, V_VDM, and V_VSM. Note that the wiring V_VDM is a virtual power supply line in which voltage input is controlled by the power switches 246 and 248, and the wiring V_VSM is a virtual power supply line in which voltage input is controlled by the power switch 247. The voltage VDHB is a high-level voltage of the wiring OGL, which is higher than VDDM.

Figure 16A:
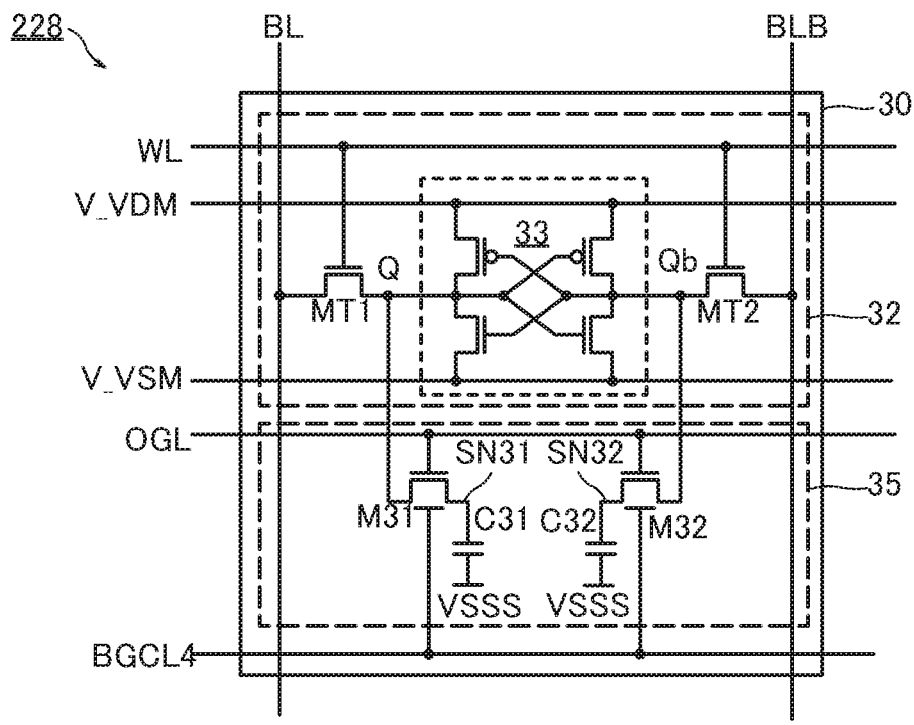
FIG. 16 A: A circuit diagram illustrating a configuration example of a memory cell array. B: A timing chart showing an example of power gating of a memory device.

As illustrated in FIG. 16A, the memory cell 30 includes a memory cell 32 and a backup circuit 35. The memory cell 32 has the same circuit configuration as a standard 6T (transistor) SRAM cell and includes transistors MT1 and MT2, nodes Q/Qb, and a latch circuit 33. The latch circuit 33 is electrically connected to the word line WL, the bit lines BL and BLB, and the wirings V_VDM and V_VSM.

The word line WL and the bit lines BL and BLB are driven by the peripheral circuit 226. The wiring V_VDM is a virtual power supply line in which voltage input is controlled by the power switches 246 and 248. The wiring V_VSM is a virtual power supply line in which voltage input is controlled by the power switch 247. The power switch 247 is not necessarily provided. In that case, a wiring for supplying the voltage VSSS is provided instead of the wiring V_VSM.

The backup circuit 35 is a circuit for backing up data in the memory cell 32. The backup circuit 35 includes a pair of 2T1C memory cells composed of transistors M31 and M32 and capacitors C31 and C32. Retention nodes of those memory cells are nodes SN21 and SN22. By providing the backup circuit 35 in the memory cell 30, power gating of the power domain 214 can be performed.

The transistors M31 and M32 are OS transistors having back gates. Gates of the transistors M31 and M32 are electrically connected to the wiring OGL. The wiring OGL is driven by the backup control circuit 227. The back gates of the transistors M31 and M32 are electrically connected to the wiring BGCL4. A voltage VBG4 is input from the voltage correction circuit 279 to the wiring BGCL4. The specifications of the transistors M31 and M32 are the same, and a replica transistor of the transistor M31 is provided in the voltage correction circuit 279. Thus, since a change in the threshold voltages VTg of the transistors M31 and M32 due to temperature can be corrected by the voltage VBG4, the backup circuit 35 with high reliability can be provided.

The driver circuit 114 may be used for the backup control circuit 227 to control the gate voltages of the transistors M31 and M32. In that case, the voltage output circuit 274 is not necessarily provided.

<<Operation Example of Memory Device 202>>

The low power consumption mode of the memory device 202 is determined by the PG control signals. There are four kinds of low power consumption modes having different break-even times (BET): (1) a bit line floating mode, (2) a sleep mode, (3) a cell array domain PG mode, and (4) an all domain PG mode. The low power consumption mode is determined based on signals PSE4 to PSE6 and the PG control signals. These signals are transmitted from the PMU, for example. With the plurality of low power consumption modes having different BETs, the power consumption of the memory device 202 can be reduced efficiently.

In the bit line floating mode, the bit line pair (BL and BLB) is brought into a floating state. Data in a memory cell 31 is not lost.

In the sleep mode, the voltage VDML lower than the voltage VDDM is supplied to the power domain 214. The voltage VDML is a voltage at which data in the memory cell 32 is not lost. The bit line pair (BL and BLB) is in a floating state.

In the cell array domain PG mode, the power switches 246 to 248 are turned off so that the supply of the voltages VDDM, VDML, and VSSM to the power domain 214 is stopped. The bit line pair (BL and BLB) is brought into a floating state. Data in the memory cell 32 is lost.

In the all domain PG mode, all the domains where power gating can be performed are subjected to power gating. The power switches 244 to 248 are off.

<Power Gating Sequence>

Figure 16B:
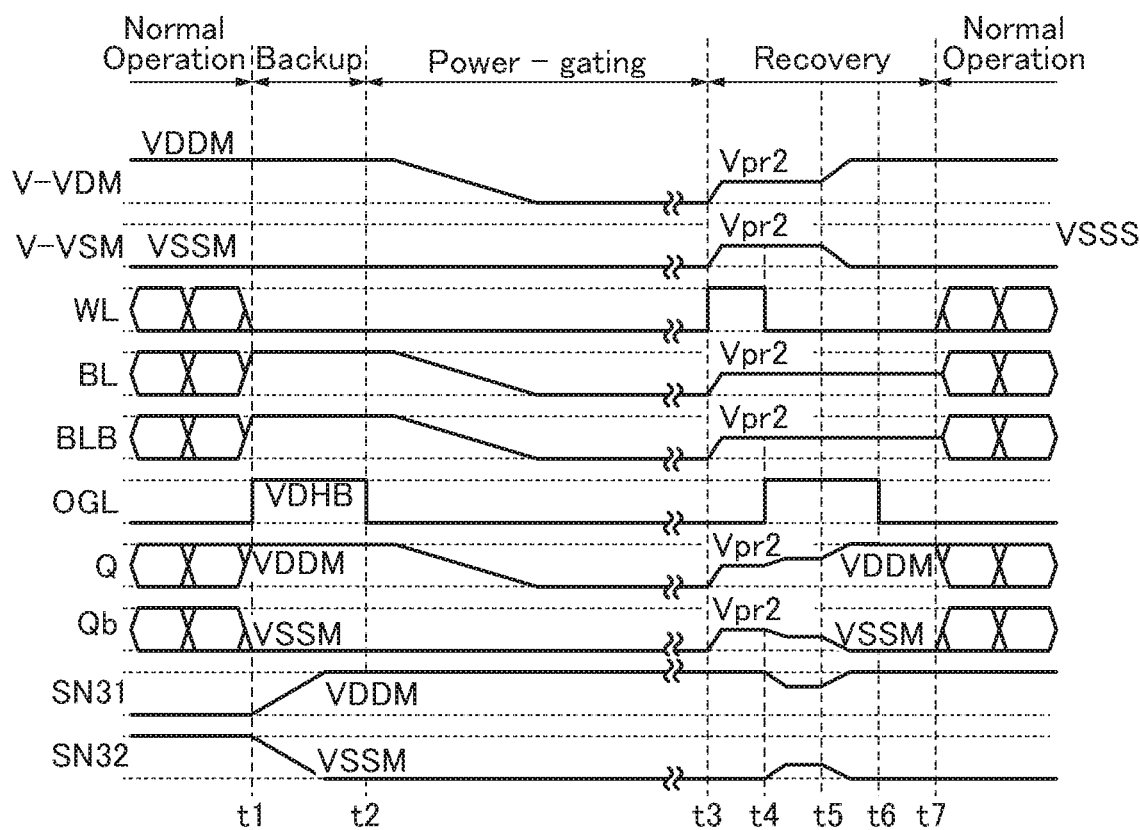

FIG. 16B shows an example of the power gating sequence of the power domain 214.

(Normal Operation (Denoted by Normal Operation in Drawing))

Before Time t1, the state of the memory device 202 is a normal operation state (a write state or a read state). In the normal operation, the memory device 202 operates in a manner similar to that of a single-port SRAM. The power switches 244 and 246 to 248 are on, and the power switch 245 is off. The control circuit 225 controls the whole memory device 202 collectively and performs data writing and data reading. The control circuit 225 processes the address signal ADDR and command signals from the outside (e.g., the chip enable signal CE, the write enable signal WE, and the byte write enable signal BW) and generates a control signal for the peripheral circuit 226.

(Backup (Denoted by Backup in Drawing))

At Time t1, a backup sequence is started in accordance with the PG control signals. The backup control circuit 227 sets all of the wirings OGL to "H". Here, since the nodes Q/Qb are at "H"/"L" and the nodes SN31/SN32 are at "L"/"H" at Time t1, when the transistors M31 and M32 are turned on, the voltage of the node SN31 increases from VSSM to VDDM and the voltage of the node SN32 decreases from VDDM to VSSM. When the signal PGM is set to "L" at Time t2, the backup operation is completed. Data in the nodes Q/Qb at Time t1 are written to the nodes SN31/SN32.

(Power Gating (Denoted by Power-Gating in Drawing))

The signal PSE4 is set to "L" at Time t2 to turn off the power switches 246 and 247, whereby power gating of the power domain 214 is started. When a voltage difference between the wiring V_VDM and the wiring V_VSM decreases, the latch circuit 33 becomes inactive. Although data in the memory cell 32 is lost, the backup circuit 35 keeps retaining data.

(Recovery (Denoted by Recovery in Drawing))

The peripheral circuit 226 and the backup control circuit 227 perform recovery operation in accordance with the PG control signals. In the recovery operation, the latch circuit 33 functions as a sense amplifier for detecting data in the nodes Q/Qb. First, the reset operation of the nodes Q and Qb is performed. At Time t3, the peripheral circuit 226 precharges all of the bit line pairs (BL and BLB). A voltage Vpr2 is input to all of the bit line pairs (BL and BLB). Next, the peripheral circuit 226 brings all of the word lines WL into selected states. The wirings V_VDM and V_VSM are precharged to the voltage Vpr2, and the voltages of the nodes Q and Qb are fixed to the voltage Vpr2.

At Time t4, the backup control circuit 227 sets all of the wirings OGL to "H". The transistors M31 and M32 are turned on. The charge in the capacitor C31 is distributed to the node Q and the node SN31, the charge in the capacitor C32 is distributed to the node Qb and the node SN32, and a voltage difference is generated between the node Q and the node Qb.

At Time t5, the power switches 246 and 247 are turned on so that input of the voltages VDDM and VSSM to the power domain 214 is resumed. When the latch circuit 33 becomes active, the voltage difference between the node Q and the node Qb is amplified. Finally, the voltages of the nodes Q and SN31 become VDDM, and the voltages of the nodes Qb and SN32 become VSSM. In other words, the states of the nodes Q/Qb are returned to the states at Time t1 ("H"/"L"). At Time t7, the recovery operation is completed, and normal operation is started.

Since a change in the threshold voltages VTg of the transistors M31 and M32 due to temperature can be corrected, in the operating temperature range, the backup circuit 35 can achieve performance substantially equivalent to that at the reference temperature Tref, for example. Thus, a reduction in retention time due to temperature rise and an increase in backup time and recovery time due to temperature fall can be inhibited. Accordingly, the memory device 202 with high reliability and low power consumption can be provided.

The monitor circuit 130 can be provided as a temperature sensor in the memory device of this embodiment. In this case, for example, the refresh cycle or the timing of power gating can be changed in accordance with the output voltage of the monitor circuit 130.

Embodiment 3

In this embodiment, a semiconductor device using an OS transistor will be described.

<<Processor 300>>

Figure 17:
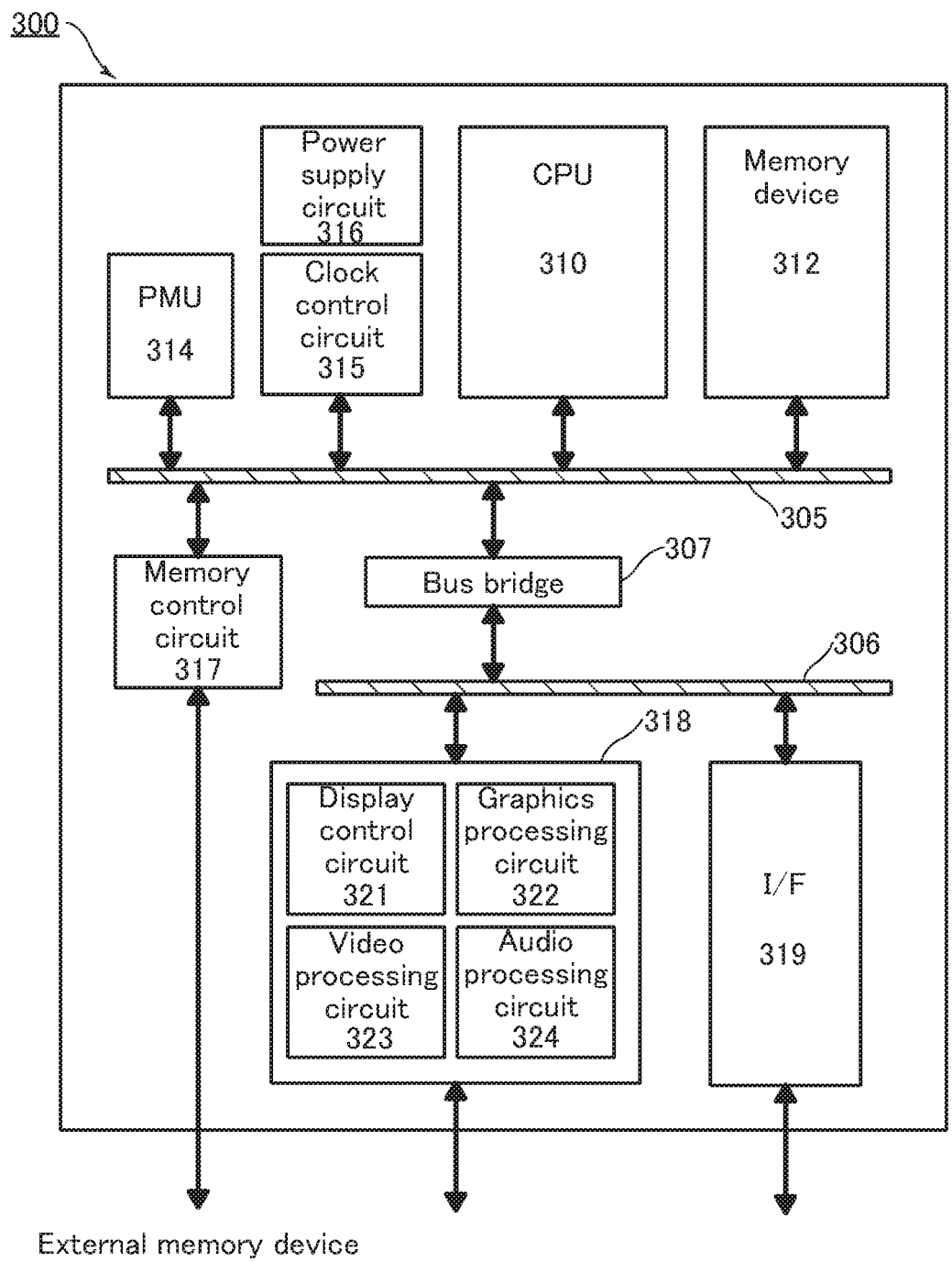
FIG. 17 A functional block diagram illustrating a structure example of a processor.

A processor 300 illustrated in FIG. 17 includes buses 305 and 306, a bus bridge 307, a CPU 310, a memory device 312, a PMU 314, a clock control circuit 315, a power supply circuit 316, a memory control circuit 317, a functional portion 318, and an interface (I/F) portion 319. The internal circuits of the processor 300 are appropriately selected. For example, a GPU may be provided in the processor 300.

As illustrated in FIG. 17, the internal circuits of the processor 300 are connected to each other by the buses 305 and 306 and the bus bridge 307 so that data can be transferred therebetween. The PMU 314 controls the clock control circuit 315 and the power supply circuit 316. The PMU 314 controls clock gating and power gating of the internal circuits of the processor 300 (e.g., the CPU 310, the memory device 312, the bus 305, and the like). The memory control circuit 317 controls an external memory device. The processor 300 can be used as an application processor. Thus, various kinds of circuits are provided in the functional portion 318 and the interface portion 319 so that various kinds of peripheral devices can be controlled by the processor 300.

As functional circuits provided in the functional portion 318, for example, a display control circuit 321, a graphics processing circuit 322, a video processing circuit 323, an audio processing circuit 324, a sound processing circuit, a timer circuit, and an ADC (analog-to-digital converter circuit) are provided.

In the interface portion 319, a circuit corresponding to the standard such as ePCI (Peripheral Component Interconnect Express), I2C (I-squared-C, Inter Integrated Circuit), MIPI (Mobile Industry Processor Interface), USB (Universal Serial Bus), SPI (Serial Peripheral Interface), HDMI (registered trademark)/DP (High-Definition Multimedia Interface/DisplayPort), eDP (embedded DisplayPort), or DSI (Display Serial Interface) is provided.

The memory device of Embodiment 2 is used as the memory device 312. A plurality of kinds of memory devices 312 may be provided in the processor 300. The PMU 314 generates a control signal for a power switch used in the memory device 312 and the PG control signals. In the case where the memory device 200 is provided in the processor 300, the voltage generation circuit 276 may be provided in the power supply circuit 316, for example. The same applies to the memory device 202.

Figure 18:
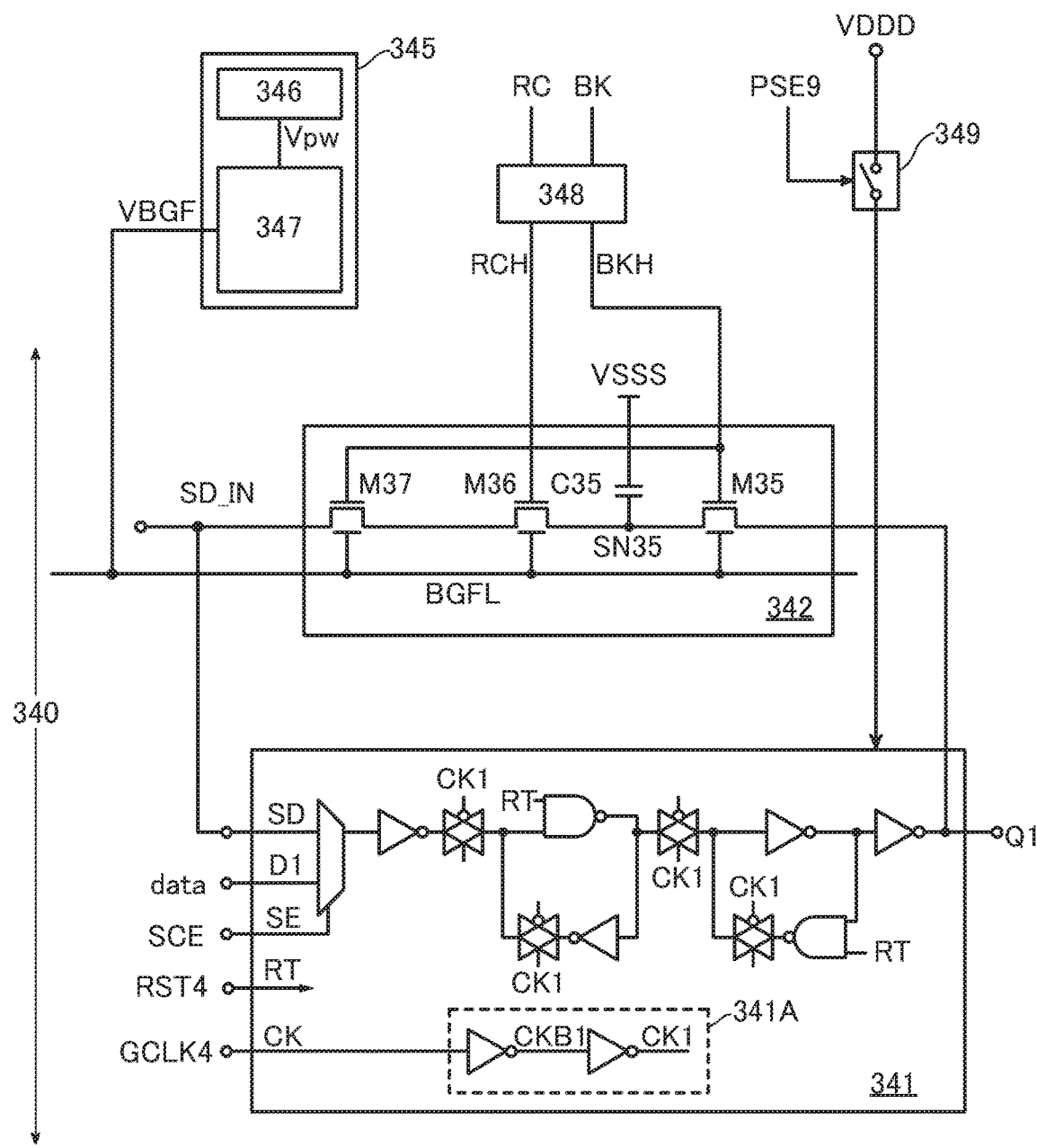
FIG. 18 A circuit diagram illustrating a configuration example of a flip-flop.

The CPU 310 includes a CPU core, a cache memory device, a voltage output circuit 345, a level shifter 348, a power switch 349, and the like (see FIG. 18). A flip-flop 340 illustrated in FIG. 18 is provided in the CPU core. The power switch 349 controls the supply of the voltage VDDD to the CPU core. The on/off of the power switch 349 is controlled by a signal PSE9 generated by the PMU 314.

<Flip-Flop 340>

The flip-flop 340 includes a scan flip-flop 341 and a backup circuit 342. The backup circuit 342 is provided in the flip-flop 340, which enables power gating of the CPU core.

The scan flip-flop 341 includes nodes D1, Q1, SD, SE, RT, and CK and a clock buffer circuit 341A. The clock buffer circuit 341A includes two inverters and nodes CK1 and CKB1. The node RT is a reset signal input node. The circuit configuration of the scan flip-flop 341 is not limited to that in FIG. 18. A flip-flop prepared in a standard circuit library can be applied.

The node D1 is a data input node, the node Q1 is a data output node, and the node SD is a scan test data input node and electrically connected to a node SD_IN of the backup circuit 342. A scan enable signal SCE, a reset signal RST4, and a clock signal GCLK4 are input to the nodes SE, CK, and RT, respectively. The scan enable signal SCE is generated in the PMU 314, and the reset signal RST4 and the clock signal GCLK4 are generated in the clock control circuit 315. The PMU 314 generates a recovery signal RC and a backup signal BK. The level shifter 348 shifts the levels of the recovery signal RC and the backup signal BK and outputs a recovery signal RCH and a backup signal BKH to the backup circuit 342.

The backup circuit 342 includes nodes SD_IN and SN35, transistors M35 to M37, and a capacitor C35. The node SD_IN is electrically connected to the node Q1 of another scan flip-flop 341. The node SN35 is a retention node of the backup circuit 342. The capacitor C35 is a storage capacitor for retaining the voltage of the node SN35.

Parasitic capacitance due to the transistor M35 is added to the node Q1, but is lower than parasitic capacitance due to a logic circuit connected to the node Q1; thus, there is no influence on the operation of the scan flip-flop 341. That is, even when the backup circuit 342 is provided, the performance of the flip-flop 340 does not substantially decrease.

The transistors M35 to M37 have the same specifications and are OS transistors having back gates. The back gates of the transistors M35 to M37 are electrically connected to a wiring BGFL. A voltage VBGF is input from the voltage output circuit 345 to the wiring BGFL.

The voltage output circuit of Embodiment 1 is used as the voltage output circuit 345 including a voltage generation circuit 346 and a voltage correction circuit 347. The voltage generation circuit 346 lowers the voltage VSSS and generates the voltage Vpw. For example, the voltage generation circuit 346 may be provided in the power supply circuit 316. When the voltage Vpw can be set to VSSS, the voltage generation circuit 346 is not provided and the voltage VSSS is output to the voltage correction circuit 347. The voltage correction circuit 347 is provided with a replica transistor of the transistor M35. The voltage VOT2 generated by the voltage correction circuit 347 is input to the wiring BGFL as the voltage VBGF.

The circuit 114A and the voltage output circuit of Embodiment 1 may be used for the level shifter 348 to correct the "H" and/or "L" voltages of the recovery signal RCH and the backup signal BK. In that case, the voltage output circuit 345 is not necessarily provided.

<Power Gating>

While the CPU core performs normal operation, the power switch 349 is on and the signals RC and BK are fixed to "L". In the case of transitioning from a normal operation state to a power gating state, data in the scan flip-flop 341 is backed up to the backup circuit 342.

The clock signal GCLK4 is deactivated. The signal BK is set to "H". The transistor M35 is turned on, and data in the node Q1 is written to the node SN35. Then, the power switch 349 is turned off to stop the supply of the voltage VDDD to the CPU core.

In the case of transitioning from the power gating state to the normal operation state, the data in the scan flip-flop 341 is written back to the backup circuit 342. First, the power switch 349 is turned on to start the supply of the voltage VDDD to the CPU core. Next, the PMU 314 outputs the signals RC and SCE at "H". The transistor M36 is turned on, and charge in the capacitor C35 is distributed to the node SN35 and the node SD. The node SE is at "H", and thus, data in the node SD is written to a latch circuit on the input side of the scan flip-flop 341. Then, the PMU 314 controls the clock control circuit 315 to activate the clock signal GCLK4. Data in the latch circuit on the input side is written to the node Q1. That is, data in the node SN35 is written to the node Q1. Next, the PMU 314 sets the signals RC and SCE to "L". The recovery operation is completed.

Since a change in the threshold voltages VTg of the transistors M35 and M36 due to temperature can be corrected, the backup circuit 342 can achieve performance substantially equivalent to that at the reference temperature Tref, for example. Thus, a reduction in retention time due to temperature rise and an increase in backup time and recovery time due to temperature fall can be inhibited. Thus, the processor 300 with high reliability and low power consumption can be provided.

The memory device of Embodiment 2 and/or the flip-flop 340 can be used for the functional portion 318, the interface portion 319, or the like.

The monitor circuit 130 can be provided in the processor of this embodiment as a temperature sensor. In this case, for example, the refresh cycle of the memory device or the timing of power gating of the processor can be changed in accordance with the output voltage of the monitor circuit 130.

Embodiment 4

Figure 19:
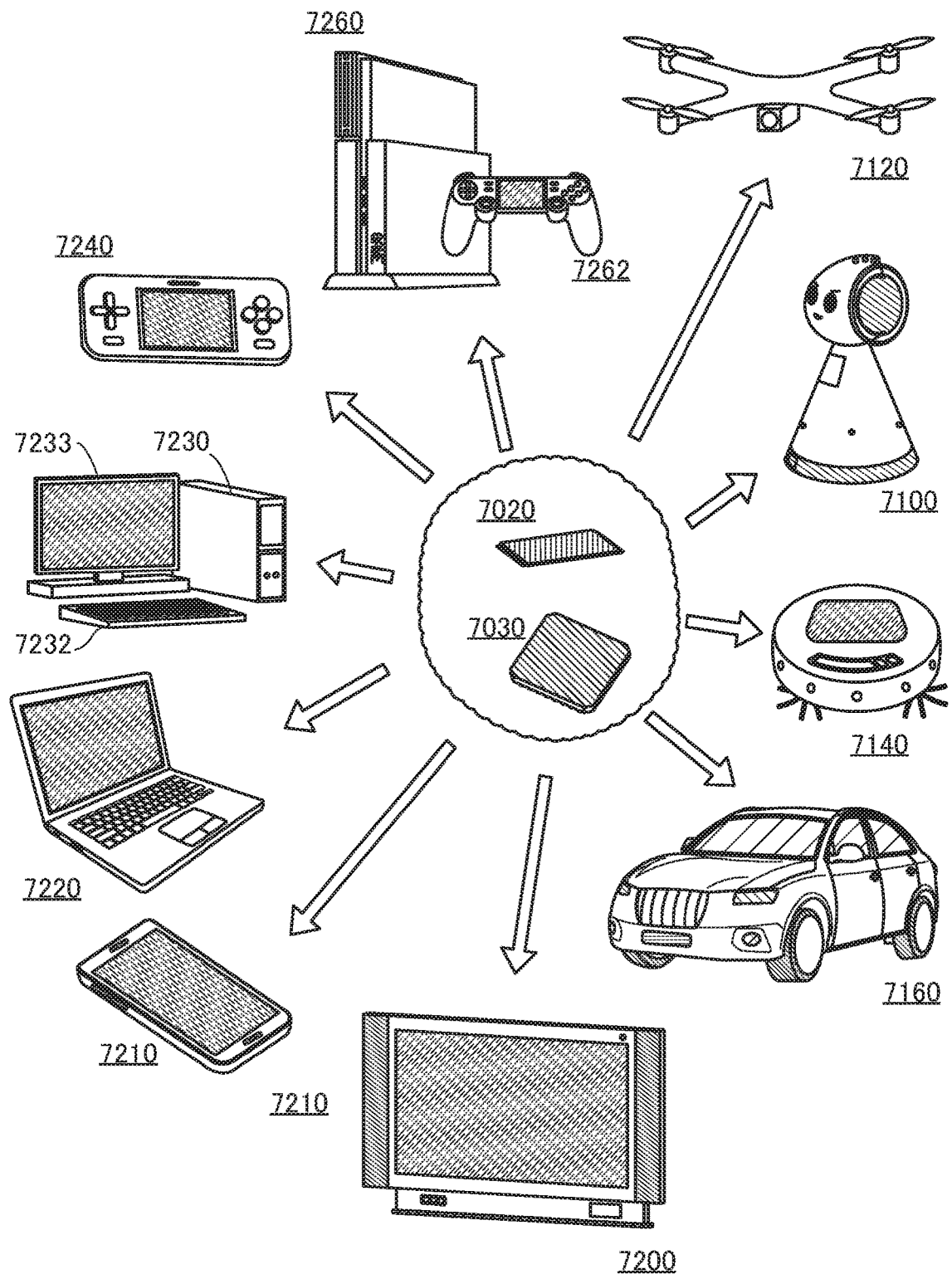
FIG. 19 A drawing illustrating examples of electronic devices.

Electronic devices in each of which the above semiconductor device is incorporated will be described with reference to FIG. 19. Electronic devices illustrated in FIG. 19 each include an electronic component 7020 and/or an electronic component 7030. The memory device of Embodiment 2 is incorporated in the electronic component 7020, and the processor of Embodiment 3 is incorporated in the electronic component 7030.

A robot 7100 includes an illuminance sensor, a microphone, a camera, a speaker, a display, various kinds of sensors (e.g., an infrared ray sensor, an ultrasonic sensor, an acceleration sensor, a piezoelectric sensor, an optical sensor, and a gyro sensor), a moving mechanism, and the like. The electronic component 7030 controls these peripheral devices. For example, the electronic component 7020 stores data obtained by the sensors.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user with the use of the microphone and the speaker.

The camera has a function of taking images of the surroundings of the robot 7100. Furthermore, the robot 7100 has a function of moving with the use of the moving mechanism. The robot 7100 can take images of the surroundings with the use of the camera, and can analyze the images to sense whether there is an obstacle in the way of the movement, for example.

A flying object 7120 includes propellers, a camera, a battery, and the like and has a function of flying autonomously. The electronic component 7030 controls these peripheral devices. The electronic component 7030 analyzes image data taken by the camera to sense whether there is an obstacle in the way of the movement, for example. For example, image data is stored in the electronic component 7020.

A cleaning robot 7140 includes a display provided on the top surface, a plurality of cameras provided on the side surface, a brush, an operation button, various kinds of sensors, and the like. Although not illustrated, the cleaning robot 7140 is provided with a tire, an inlet, and the like. The cleaning robot 7140 can run autonomously, detect dust, and vacuum the dust through the inlet provided on the bottom surface. For example, the electronic component 7030 analyzes images taken by the cameras to judge whether there is an obstacle such as a wall, furniture, or a step. In the case where an object that is likely to be caught in the brush, such as a wire, is detected by image analysis, the rotation of the brush is stopped.

An automobile 7160 includes an engine, tires, a brake, a steering gear, a camera, and the like. For example, the electronic component 7030 performs control for optimizing the running state of the automobile 7160 on the basis of navigation information, the speed, the state of the engine, the gearshift state, the use frequency of the brake, and other data. For example, image data taken by the camera is stored in the electronic component 7020.

The electronic component 7020 and/or the electronic component 7030 can be incorporated in a TV device (a television receiver) 7200, a smartphone 7210, PCs (personal computers) 7220 and 7230, a game console 7240, a game console 7260, and the like. For example, the electronic component 7030 incorporated in the TV device 7200 functions as an image processing engine. The electronic component 7030 performs, for example, image processing such as noise removal and resolution up-conversion.

The smartphone 7210 is an example of a portable information terminal. The smartphone 7210 includes a microphone, a camera, a speaker, various kinds of sensors, and a display portion. The electronic component 7030 controls these peripheral devices.

The PC 7220 and the PC 7230 are examples of a notebook PC and a desktop PC. To the PC 7230, a keyboard 7232 and a monitor device 7233 can be connected with or without a wire. The game console 7240 is an example of a portable game console. The game console 7260 is an example of a stationary game console. To the game console 7260, a controller 7262 is connected with or without a wire. The electronic component 7020 and/or the electronic component 7030 can be incorporated in the controller 7262.

Embodiment 5

In this embodiment, OS transistors are described.
<OS Transistor 590>

Figure 20A:
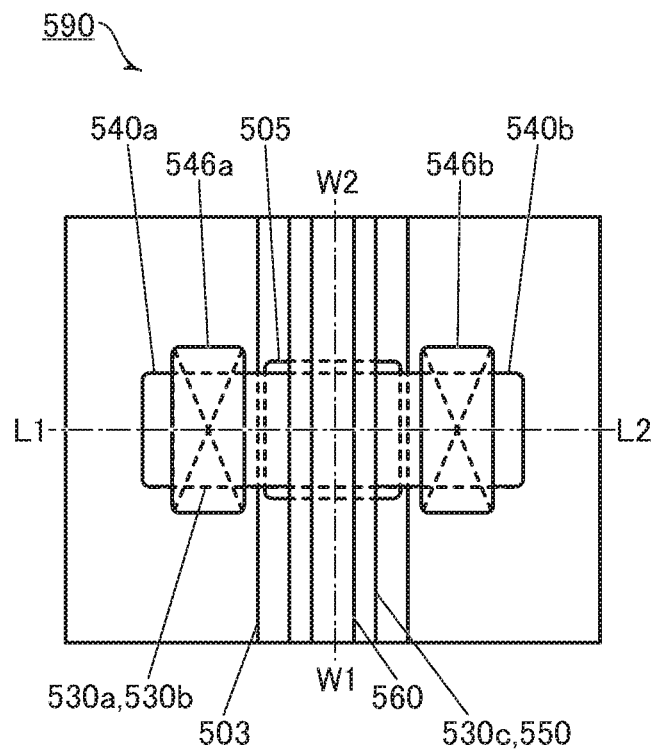
FIG. 20 A: A top view illustrating a structure example of an OS transistor. B, C: Cross-sectional views illustrating a structure example of the OS transistor.
Figure 20C:
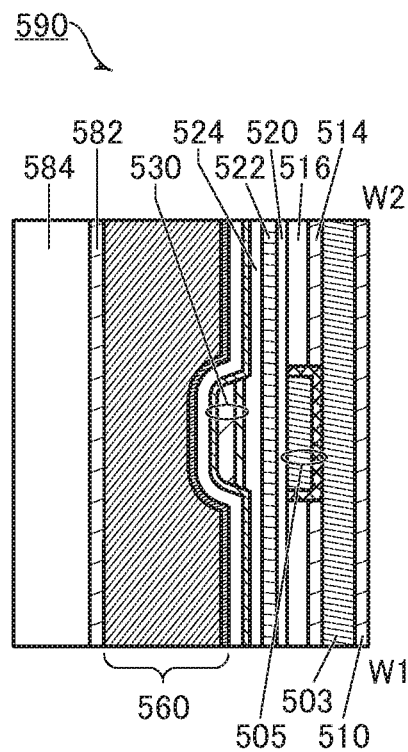
Figure 20B:
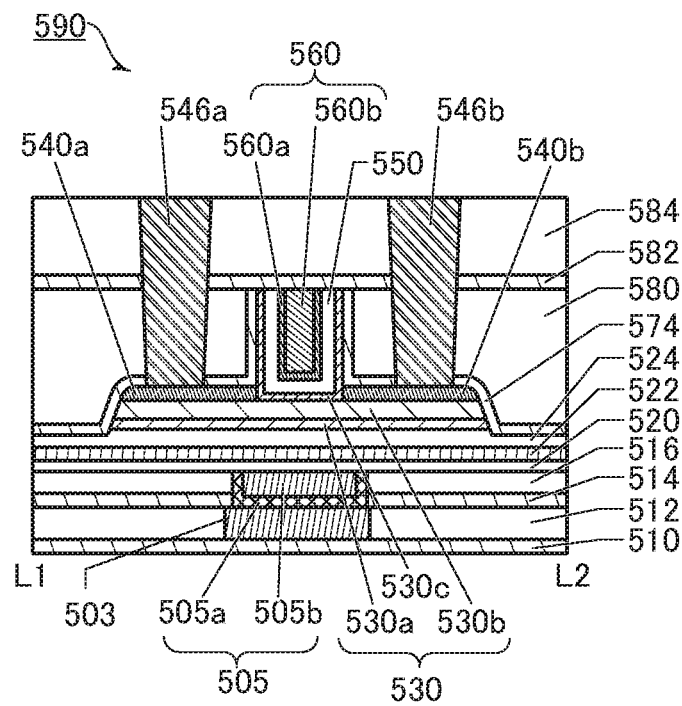

FIG. 20A to FIG. 20C are a top view, a cross-sectional view in a channel length direction, and a cross-sectional view in a channel width direction of an OS transistor 590, respectively. An L1-L2 line and a W1-W2 line shown in FIG. 20A are cutting lines. For clarification of the drawing, some components are omitted in FIG. 20A.

In FIG. 20A to FIG. 20C, the OS transistor 590, an insulating layer 510, an insulating layer 512, an insulating layer 514, an insulating layer 516, an insulating layer 580, an insulating layer 582, an insulating layer 584, a conductive layer 546a, a conductive layer 546b, and a conductive layer 503 are illustrated. The conductive layer 546a and the conductive layer 546b form contact plugs, and the conductive layer 503 forms a wiring, for example.

The OS transistor 590 includes a conductive layer 560 (a conductive layer 560a and a conductive layer 560b) functioning as a gate; a conductive layer 505 (a conductive layer 505a and a conductive layer 505b) functioning as a back gate; an insulating layer 550 functioning as a gate insulating layer; insulating layers 520, 522, and 524 each functioning as a back gate insulating layer; an oxide layer 530 (an oxide layer 530a, an oxide layer 530b, and an oxide layer 530c) including a channel formation region; conductive layers 540a and 540b functioning as a source region and a drain region; and an insulating layer 574.

The oxide layer 530c, the insulating layer 550, and the conductive layer 560 are positioned in an opening portion provided in the insulating layer 580 with the insulating layer 574 positioned therebetween. The oxide layer 530c, the insulating layer 550, and the conductive layer 560 are positioned between the conductive layer 540a and the conductive layer 540b.

The insulating layers 510 and 512 function as interlayer films. The dielectric constant of the insulating layer 512 is preferably lower than that of the insulating layer 510. When a material with a low dielectric constant is used for the interlayer films, the parasitic capacitance generated between wirings can be reduced. Each of the insulating layers 510 and 512 is not limited to a single layer, and may be a stacked layer. Similarly, other insulating layers, conductive layers, and oxide layers may each also be either a single layer or a stacked layer.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

The insulating layer 510 preferably has a barrier property with which entry of impurities such as water and hydrogen into the OS transistor 590 is inhibited. An insulating material used for the insulating layer 510 is preferably an insulating material that has a function of inhibiting diffusion of impurities such as a hydrogen atom, a hydrogen molecule, a water molecule, and a copper atom (through which the above impurities do not easily pass). Alternatively, it is preferable to use an insulating material that has a function of inhibiting diffusion of oxygen (e.g., at least one of oxygen atoms, oxygen molecules, and the like) (through which the above oxygen does not easily pass). Examples of an insulating material having such a function include aluminum oxide and silicon nitride.

The conductive layer 503 is formed to be embedded in the insulating layer 512. The level of the top surface of the conductive layer 503 and the level of the top surface of the insulating layer 512 can be substantially the same. For the conductive layer 503, a conductive material that has high conductivity and contains tungsten, copper, or aluminum as its main component is preferably used.

When the conductive layer 505 and the conductive layer 560 overlap with each other, in the case where a potential is applied to the conductive layer 560 and the conductive layer 505, an electric field generated from the conductive layer 560 and an electric field generated from the conductive layer 505 are connected and can cover a channel formation region formed in the oxide layer 530 in some cases. That is, the channel formation region can be electrically surrounded by an electric field of the gate and an electric field of the back gate. In this specification, a transistor structure in which a channel formation region is electrically surrounded by electric fields of a gate and a back gate is referred to as a surrounded channel (S-channel) structure.

Like the insulating layer 510, the insulating layers 514 and 516 function as interlayer films. The insulating layer 514 is, for example, preferably a barrier film that inhibits diffusion of impurities so that impurities such as water and hydrogen are inhibited from entering the OS transistor 590. To reduce the parasitic capacitance generated between wirings, the insulating layer 516 preferably has a lower dielectric constant than the insulating layer 514, for example.

The conductive layer 505 is formed in contact with an inner wall of an opening in the insulating layers 514 and 516. The top surfaces of the conductive layer 505a and the conductive layer 505b and the top surface of the insulating layer 516 can be substantially level with each other. For the conductive layer 505a, it is preferable to use a conductive material having a function of inhibiting diffusion of impurities such as a hydrogen atom, a hydrogen molecule, a water molecule, and a copper atom (a conductive material through which impurities do not easily pass), or a conductive material having a function of inhibiting diffusion of oxygen (e.g., an oxygen atom and an oxygen molecule, and the like) (through which the above oxygen do not easily pass) (hereinafter, referred to as a conductive material through which oxygen does not easily pass). Note that in this specification, a function of inhibiting diffusion of impurities or oxygen means a function of inhibiting diffusion of at least one of the above impurities and the above oxygen. For example, when the conductive layer 505a has a function of inhibiting diffusion of oxygen, a reduction in conductivity of the conductive layer 505b due to oxidation can be inhibited.

In the case where the conductive layer 505 doubles as a wiring, the conductive layer 505b includes a conductive layer containing tungsten, copper, or aluminum as its main component. The conductive layer 505b may be a stacked layer including the above conductive layer and titanium or titanium nitride. A conductive material layer that has high conductivity is preferably used as the conductive layer 505. In that case, the conductive layer 503 is not necessarily provided.

The insulating layer 522 preferably has a barrier property. The insulating layer 522 having a barrier property functions as a layer that inhibits entry of impurities such as hydrogen into the OS transistor 590 from the surroundings of the OS transistor 590. For the insulating layer 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of OS transistors progress, a problem such as leakage current may arise because of a thinner gate insulating layer. When a high-k material is used for the gate insulating layer, a gate voltage can be reduced while the physical thickness of the gate insulating layer is maintained.

It is preferable that the insulating layer 520 be thermally stable. For example, silicon oxide and silicon oxynitride, which have thermal stability, are preferable. In addition, a combination of an insulator of a high-k material and the insulating layer 522 allows the gate insulating layer to have a stacked-layer structure with thermal stability and a high dielectric constant.

[Oxide Semiconductor]

The oxide semiconductor layer of the OS transistor preferably includes a metal oxide containing at least indium or zinc. In particular, a metal oxide containing indium and zinc is preferable. Moreover, aluminum, gallium, yttrium, tin, or the like is preferably contained in addition to them. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where the metal oxide contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that it is sometimes acceptable to use a plurality of the above-described elements in combination as the element M.

Note that in this specification and the like, a metal oxide also includes a metal oxide containing nitrogen in its category. When distinguished from a metal oxide, a metal oxide containing nitrogen may be referred to as a metal oxynitride.

The above metal oxide can be used for each of the oxide layers 530a to 530c. The oxide layer 530 includes a region where the oxide layers 530a to 530c are stacked. This region serves as a channel formation region, and a channel is formed mainly in the oxide layer 530b. The existence of the oxide layers 530a and 530c in the oxide layer 530 can inhibit diffusion of impurities into the oxide layer 530b.

The oxide layer 530c is preferably provided in the opening in the insulating layer 580 with the insulating layer 574 positioned therebetween. When the insulating layer 574 has a barrier property, diffusion of impurities from the insulating layer 580 into the oxide layer 530 can be inhibited.

For the conductive layers 540a and 540b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and its oxidation resistance is high. For example, in the case where the conductive layers 540a and 540b have a two-layer structure, a stacked-layer film in which a tungsten film is stacked over a tantalum nitride film, an aluminum film is stacked over a titanium film or a tungsten film, or a copper film is stacked over an alloy film of copper, magnesium, and aluminum, a titanium film, or a tungsten film is used.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

A barrier layer having a barrier property against oxygen or hydrogen may be provided over the conductive layers 540a and 540b. This structure can inhibit oxidation of the conductive layers 540a and 540b at the time of depositing the insulating layer 574. A metal oxide can be used for the barrier layer, for example. It is particularly preferable to use an insulating material having a barrier property against oxygen or hydrogen. Alternatively, a silicon nitride layer formed by a CVD method may be used. With the barrier layer provided over the conductive layers 540a and 540b, the range of choices for the material of the conductive layers 540a and 540b can be expanded. For example, a material having a low oxidation resistance and high conductivity, such as tungsten or aluminum, can be used for the conductive layers 540a and 540b. Moreover, for example, a conductor that can be easily deposited or processed can be used.

The insulating layer 550 is preferably provided in the opening portion provided in the insulating layer 580 with the oxide layer 530c and the insulating layer 574 positioned therebetween. As miniaturization and high integration of transistors progress, a problem such as leakage current may clearly arise because of a thinner gate insulating layer. The insulating layer 550 forms a gate insulating layer and can have a structure similar to that of the above back gate insulating layer.

For the conductive layer 560a, like the conductive layer 505a, it is preferable to use a conductive material having a function of inhibiting diffusion of impurities or oxygen. In particular, the conductive layer 560a having a function of inhibiting diffusion of oxygen inhibits oxidation of the conductive layer 560b, thereby preventing the decrease in conductivity. Therefore, the range of choices for the material of the conductive layer 560b can be expanded.

As a conductive material having a function of inhibiting diffusion of oxygen, for example, tantalum, tantalum nitride, ruthenium, or ruthenium oxide is preferably used. For the conductive layer 560a, the metal oxide that can be used as the oxide layer 530 can be used. In that case, when the conductive layer 560b is deposited by a sputtering method, the electric resistance of the conductive layer 560a is lowered so that the conductive layer 560a can become a conductor. This can be referred to as an OC (Oxide Conductor) electrode.

The conductive layer 560 functions as a wiring and thus a conductor having high conductivity is preferably used for the conductive layer 560b. For the conductive layer 560b, a conductive material containing tungsten, copper, or aluminum as its main component is preferably used.

The insulating layer 574 preferably has a barrier property with which diffusion of impurities such as water and hydrogen and oxygen is inhibited. With the insulating layer 574, diffusion of impurities such as water and hydrogen contained in the insulating layer 580 into the oxide layer 530b through the oxide layer 530c and the insulating layer 550 can be inhibited. Moreover, oxidation of the conductive layer 560 due to excess oxygen contained in the insulating layer 580 can be inhibited.

For example, aluminum oxide or hafnium oxide is preferably used for the insulating layer 574. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulating layers 580, 582, and 584 function as interlayer films. Like the insulating layer 514, the insulating layer 582 preferably functions as a barrier layer that inhibits entry of impurities such as water and hydrogen into the OS transistor 590 from the outside. Like the insulating layer 516, the insulating layers 580 and 584 preferably have a lower dielectric constant than the insulating layer 582. When a material with a low dielectric constant is used for the interlayer films, the parasitic capacitance generated between wirings can be reduced.

The OS transistor 590 may be electrically connected to another component through a plug or a wiring such as the conductive layer 546a, the conductive layer 546b, or the like embedded in the insulating layers 580, 582, and 584. As a material for the conductive layer 546a and the conductive layer 546b, a conductive material such as a metal material, an alloy material, a metal nitride material, or a metal oxide material can be used, as that for the conductive layer 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance For example, when the conductive layer 546a and the conductive layer 546b are each a stacked layer including tantalum nitride or the like, which has a barrier property against hydrogen and oxygen, and tungsten, which has high conductivity, diffusion of impurities from the outside can be inhibited while the conductivity of a wiring is maintained.
<OS Transistor 592>

Figure 21A:
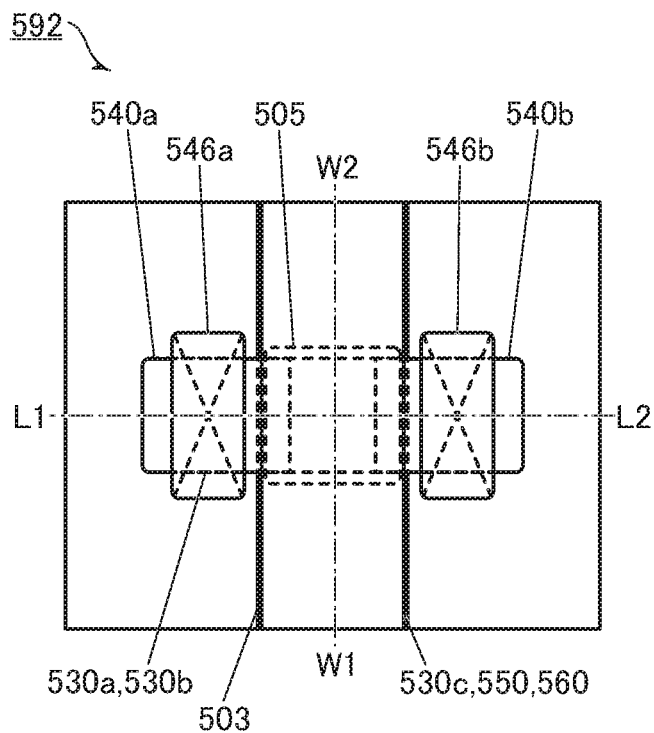
FIG. 21 A: A top view illustrating a structure example of an OS transistor. B, C: Cross-sectional views illustrating a structure example of the OS transistor.
Figure 21C:
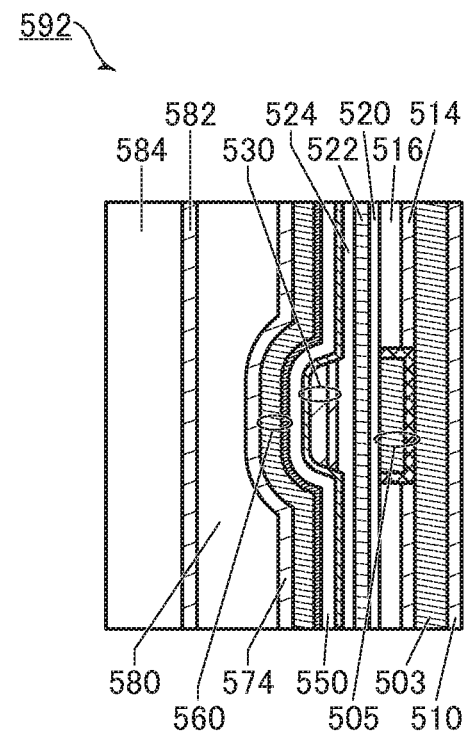
Figure 21B:
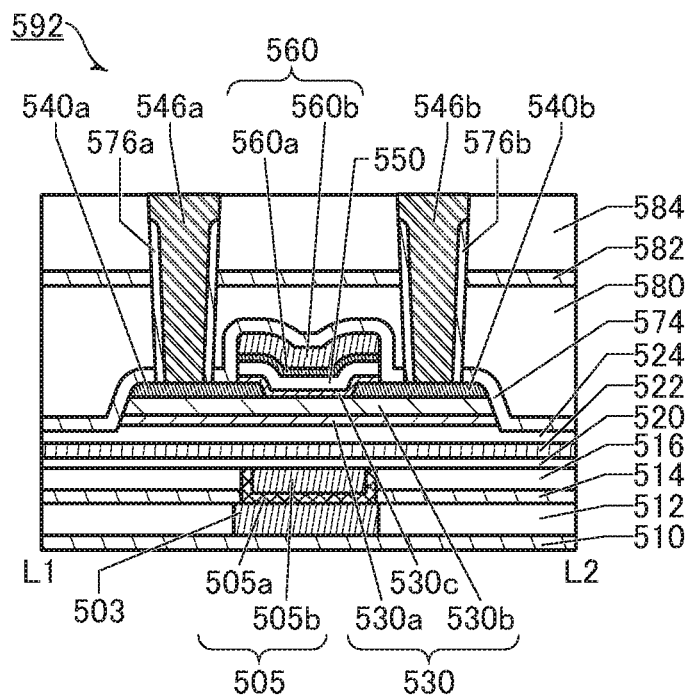

FIG. 21A to FIG. 21C are respectively a top view, a cross-sectional view in a channel length direction, and a cross-sectional view in a channel width direction of an OS transistor 592. An L1-L2 line and a W1-W2 line shown in FIG. 21A are cutting lines. For clarification of the drawing, some components are omitted in FIG. 21A.

The OS transistor 592 is a variation example of the OS transistor 592; therefore, differences from the OS transistor 592 are mainly described.

The OS transistor 592 includes a region where the conductive layers 540a and 540b each overlap with the oxide layer 530c, the insulating layer 550, and the conductive layer 560. With this structure, an OS transistor having a high on-state current can be provided. Moreover, an OS transistor having high controllability can be provided.

The conductive layer 560 includes the conductive layer 560b over the conductive layer 560a. Like the conductive layer 505a, the conductive layer 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

The conductive layer 560a having a function of inhibiting diffusion of oxygen inhibits oxidation of the conductive layer 560b, thereby preventing the decrease in conductivity. Therefore, the range of choices for the material of the conductive layer 560b can be expanded.

The insulating layer 574 is preferably provided to cover the top surface and the side surface of the conductive layer 560, the side surface of the insulating layer 550, and the side surface of the oxide layer 530c. For the insulating layer 574, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulating layer 574 can inhibit oxidation of the conductive layer 560. Moreover, the insulating layer 574 can inhibit diffusion of impurities such as water and hydrogen contained in the insulating layer 580 into the OS transistor 592.

The insulating layer 576 (the insulating layer 576a and the insulating layer 576b) having a barrier property may be provided between the conductive layer 546a or the conductive layer 546b and the insulating layer 580. Providing the insulating layer 576 can prevent oxygen in the insulating layer 580 from reacting with the conductive layer 546a or the conductive layer 546b and oxidizing the conductive layer 546a or the conductive layer 546b.

Furthermore, with the insulating layer 576 having a barrier property, the range of choices for the material of the conductor used as the plug or the wiring can be expanded.

The use of a metal material having an oxygen absorbing property and high conductivity for the conductive layer 546a and the conductive layer 546b, for example, can provide a semiconductor device with low power consumption. Specifically, a material having a low oxidation resistance and high conductivity, such as tungsten or aluminum, can be used. Moreover, for example, a conductor that can be easily deposited or processed can be used.

REFERENCE NUMERALS

10: circuit, 100, 101, 102, 103, 110, 112, 113: semiconductor device, 114: driver circuit, 114A: circuit, 118: power domain, 120, 122, 124: voltage output circuit, 130, 131: monitor circuit, 132: reset circuit, 134: source follower circuit, 136: operational amplifier, 138: switch circuit, 140: voltage generation portion, 143: charge pump circuit, 150: voltage correction circuit, 160: voltage correction circuit, 170: voltage generation circuit, 171: control circuit, 173: charge pump circuit

The invention claimed is:

1. A semiconductor device comprising a first transistor, a first capacitor, a first output terminal, a first switch, and a second switch,
   wherein a gate and a source of the first transistor are electrically connected to each other,
   wherein a first terminal of the first capacitor and the first output terminal are electrically connected to a back gate of the first transistor,
   wherein a second terminal of the first capacitor is electrically connected to the source,
   wherein the first switch controls input of a first voltage to the back gate,
   wherein a second voltage is input to a drain of the first transistor, and
   wherein the second switch controls input of a third voltage to the source.

2. The semiconductor device according to claim 1,
   wherein the first switch and the second switch are each a transistor including a metal oxide in a channel formation region.

3. The semiconductor device according to claim 1,
   wherein the first transistor is an n-channel transistor,
   wherein the first to third voltages are constant voltages, and
   wherein the second voltage and the third voltage are set so that the first transistor shows normally-on characteristics and a voltage between the drain and the source is higher than 0 V.

4. The semiconductor device according to claim 1,
   wherein the first transistor is a p-channel transistor,
   wherein the first to third voltages are constant voltages, and
   wherein the second voltage and the third voltage are set so that the first transistor shows normally-on characteristics and a voltage between the drain and the source is lower than 0 V.

5. The semiconductor device according to claim 1, further comprising a second transistor comprising a back gate,
   wherein a voltage input to the back gate of the second transistor is changed in accordance with a fourth voltage output from the first output terminal.

6. The semiconductor device according to claim 1, further comprising a third transistor,
   wherein a voltage input to a gate of the third transistor is changed in accordance with a fourth voltage output from the first output terminal.

7. The semiconductor device according to claim 1, further comprising a second capacitor, a current-voltage converter circuit, and an amplifier circuit,
   wherein a first terminal of the second capacitor is electrically connected to the first output terminal,
   wherein a second terminal of the second capacitor is electrically connected to an input terminal of the current-voltage converter circuit, and
   wherein the amplifier circuit amplifies a fifth voltage output from the current-voltage converter circuit and outputs a sixth voltage.

8. The semiconductor device according to claim 7,
   wherein the current-voltage converter circuit is a source follower circuit.

9. The semiconductor device according to claim 7,
   wherein the sixth voltage decreases as temperature rises.

10. The semiconductor device according to claim 7,
    wherein the amplifier circuit is an operational amplifier.

11. The semiconductor device according to claim 7, further comprising a fourth transistor comprising a back gate,
    wherein a voltage input to the back gate of the fourth transistor is changed in accordance with the sixth voltage.

12. The semiconductor device according to claim 7, further comprising a fifth transistor,
    wherein a voltage input to a gate of the fifth transistor is changed in accordance with the sixth voltage.

13. A method for operating the semiconductor device according to claim 1, comprising:
    turning on the first switch and the second switch;
    turning on the first switch and turning off the second switch;
    turning off the first switch and turning off the second switch; and
    turning off the first switch and turning on the second switch.

14. A semiconductor device comprising a first transistor, a first capacitor, a first output terminal, a first switch, a second switch, a second capacitor, a current-voltage converter circuit, and an amplifier circuit,
    wherein a gate and a source of the first transistor are electrically connected to each other,
    wherein a first terminal of the first capacitor and the first output terminal are electrically connected to a back gate of the first transistor,
    wherein a second terminal of the first capacitor is electrically connected to the source,
    wherein the first switch controls input of a first voltage to the back gate,
    wherein a second voltage is input to a drain of the first transistor,
    wherein the second switch controls input of a third voltage to the source,
    wherein the first switch and the second switch are each a transistor including a metal oxide in a channel formation region,
    wherein a first terminal of the second capacitor is electrically connected to the first output terminal,
    wherein a second terminal of the second capacitor is electrically connected to an input terminal of the current-voltage converter circuit, and
    wherein the amplifier circuit amplifies a fifth voltage output from the current-voltage converter circuit and outputs a sixth voltage.

15. The semiconductor device according to claim 14, wherein the current-voltage converter circuit is a source follower circuit.

16. The semiconductor device according to claim 14, wherein the sixth voltage decreases as temperature rises.

17. A method for operating the semiconductor device according to claim 14, comprising:
   turning on the first switch and the second switch;
   turning on the first switch and turning off the second switch;
   turning off the first switch and turning off the second switch; and
   turning off the first switch and turning on the second switch.

* * * * *